United States Patent
Taghivand et al.

(10) Patent No.: US 8,829,954 B2
(45) Date of Patent: Sep. 9, 2014

(54) FREQUENCY DIVIDER CIRCUIT

(75) Inventors: Mazhareddin Taghivand, Campbell, CA (US); Jafar Savoj, Sunnyvale, CA (US); Mingdeng Chen, Palo Alto, CA (US)

(73) Assignee: QUALCOMM Incorporated, San Diego, CA (US)

( * ) Notice: Subject to any disclaimer, the term of this patent is extended or adjusted under 35 U.S.C. 154(b) by 138 days.

(21) Appl. No.: 13/070,252

(22) Filed: Mar. 23, 2011

(65) Prior Publication Data

US 2012/0242378 A1 Sep. 27, 2012

(51) Int. Cl.
| | |
|---|---|
| H03B 19/06 | (2006.01) |
| H03B 19/14 | (2006.01) |
| H03K 23/42 | (2006.01) |
| H03K 3/356 | (2006.01) |

(52) U.S. Cl.
CPC .......... *H03K 3/356182* (2013.01); *H03B 19/14* (2013.01); *H03K 23/425* (2013.01)
USPC ............................. 327/118; 327/115; 327/117

(58) Field of Classification Search
CPC . H03K 3/35613; H03K 21/026; H03B 19/00; H03B 19/14; G06F 7/68
USPC ............... 327/113–115, 117, 118; 377/47, 48
See application file for complete search history.

(56) References Cited

U.S. PATENT DOCUMENTS

| | | | | |
|---|---|---|---|---|
| 3,997,796 | A | * | 12/1976 | Sanders et al. ................ 327/118 |
| 7,522,007 | B2 | * | 4/2009 | Jang et al. ..................... 331/172 |
| 7,719,313 | B2 | | 5/2010 | Narathong et al. |
| 8,362,809 | B2 | * | 1/2013 | Li et al. ......................... 327/105 |
| 2001/0001522 | A1 | | 5/2001 | Mai et al. |
| 2008/0001633 | A1 | * | 1/2008 | Narathong et al. ............. 326/87 |
| 2010/0207695 | A1 | * | 8/2010 | Bao ......................... 331/117 FE |
| 2011/0001522 | A1 | * | 1/2011 | Chan et al. .................... 327/118 |
| 2011/0050296 | A1 | * | 3/2011 | Fagg ............................. 327/118 |

FOREIGN PATENT DOCUMENTS

CN 101924553 A 12/2010

OTHER PUBLICATIONS

Seong-Jun Song; Sung Min Park; Hoi-Jun Yoo, "A 4-Gb/s CMOS clock and data recovery circuit using 1/8-rate clock technique," IEEE Journal of Solid-State Circuits, vol. 38, No. 7, pp. 1213-1219, Jul. 2003.
International Search Report and Written Opinion—PCT/US2012/030474—ISA/EPO—Jul. 13, 2012.

* cited by examiner

*Primary Examiner* — Patrick O'Neill

(57) ABSTRACT

A frequency divider circuit is described. The frequency divider circuit includes a first cross-coupling. The first cross-coupling includes a first cross-coupled transistor with a first gate. The first gate is separately biased. The first cross-coupling also includes a second cross-coupled transistor with a second gate. The second gate is separately biased. The first gate is coupled to the second cross-coupled transistor and the second gate is coupled to the first cross-coupled transistor.

43 Claims, 12 Drawing Sheets

FREQUENCY DIVIDER CIRCUIT

TECHNICAL FIELD

The present disclosure relates generally to electronic devices. More specifically, the present disclosure relates to a frequency divider circuit.

BACKGROUND

Electronic devices (cellular telephones, wireless modems, computers, digital music players, Global Positioning System units, Personal Digital Assistants, gaming devices, etc.) have become a part of everyday life. Small computing devices are now placed in everything from automobiles to housing locks. The complexity of electronic devices has increased dramatically in the last few years. For example, many electronic devices have one or more processors that help control the device, as well as a number of digital circuits to support the processor and other parts of the device. Furthermore, the size of electronic devices has diminished to the point where a multitude of transistors may be placed on a very small integrated circuit. Power consumption for electronic devices has also diminished.

Although the size and power consumption of electronic devices have been reduced, further gains in size reduction and power efficiency are being sought. Reductions in power are particularly important for mobile electronic devices that use battery power to function. Additionally, minimal sizes for electronic circuits (i.e., included in electronic devices) are being sought as smaller form factors may be appealing to consumers or gains in chip real estate may be dedicated to improved functionality.

Many electronic circuits use oscillating signals (e.g., clock signals) in order to function properly. That is, many of the functions performed by high-speed electronic circuits require a precise timing signal at one or more frequencies to operate as desired. Like other electronic circuits, however, an electronic circuit that produces oscillating signals at certain frequencies requires space for implementation and electrical power to run. Thus, reductions in the power consumption and/or area of electronic circuits that provide oscillating signals may be beneficial.

SUMMARY

A frequency divider circuit is disclosed. The frequency divider circuit includes a first cross-coupling. The first cross-coupling includes a first cross-coupled transistor having a first gate, where the first gate is separately biased and a second cross-coupled transistor having a second gate, where the second gate is separately biased and where the first gate is coupled to the second cross-coupled transistor and the second gate is coupled to the first cross-coupled transistor.

The first cross-coupled transistor and the second cross-coupled transistor may be coupled to a supply voltage, where the supply voltage may be less than 1.3 volts. The first gate may be coupled to the second transistor using at least one capacitor and the second gate may be coupled to the first transistor using at least one capacitor.

The first cross-coupled transistor may be a P-channel metal-oxide-semiconductor (PMOS) transistor having a first drain and the second cross-coupled transistor may be a PMOS transistor having a second drain, where the first gate may be coupled to the second drain and the second gate may be coupled to the first drain.

The first cross-coupled transistor may be an N-channel metal-oxide-semiconductor (NMOS) transistor having a first drain and the second cross-coupled transistor may be an NMOS transistor having a second drain, where the first gate may be coupled to the second drain and the second gate may be coupled to the first drain. The first gate and second gate may be each separately biased using a bias voltage applied through at least one bias resistor.

The frequency divider circuit may also include one or more resistors that may be coupled between the first cross-coupled transistor and the second cross-coupled transistor. The frequency divider circuit may also include a switch that may be coupled between the first cross-coupled transistor and the second cross-coupled transistor.

The frequency divider circuit may also include a first other transistor and a second other transistor, where the first other transistor may be coupled to the first cross-coupled transistor, the second other transistor may be coupled to the second cross-coupled transistor and a first input transistor, where the first input transistor may be coupled to the first other transistor and the second other transistor and the first input transistor may be coupled to ground.

The frequency divider circuit may also include a second cross-coupling. The second cross-coupling may include a third cross-coupled transistor having a third gate, where the third gate may be separately biased and a fourth cross-coupled transistor having a fourth gate where the fourth gate may be separately biased and where the third gate may be coupled to the fourth cross-coupled transistor and the fourth gate may be coupled to the third cross-coupled transistor. The second cross-coupling may also include a third other transistor and a fourth other transistor, where the third other transistor may be coupled to the third cross-coupled transistor and the fourth other transistor may be coupled to the fourth cross-coupled transistor and where the third cross-coupled transistor and the fourth cross-coupled transistor may be coupled to a supply voltage and a second input transistor, where the second input transistor may be coupled to the third other transistor and the fourth other transistor and where the second input transistor may be coupled to ground.

The frequency divider circuit may receive differential input signals at an input frequency at the first input transistor and the second input transistor and may output frequency-divided differential quadrature signals (I, $\bar{\text{I}}$, Q, $\bar{\text{Q}}$) at the cross-coupled transistors. The frequency-divided differential quadrature signals (I, $\bar{\text{I}}$, Q, $\bar{\text{Q}}$) may be divided in frequency by an approximate factor of two from the input frequency.

The frequency divider circuit may also include a first additional transistor having a first additional transistor gate and a second additional transistor having a second additional transistor gate, where the first additional transistor gate may be coupled to the second additional transistor, the second additional transistor gate may be coupled to the first additional transistor, the first additional transistor may be coupled to the first cross-coupled transistor and the second additional transistor may be coupled to the second cross-coupled transistor. The frequency divider circuit may also include a first other transistor and a second other transistor, where the first other transistor may be coupled to the first additional transistor and the first cross-coupled transistor and the second other transistor may be coupled to the second additional transistor and the second cross-coupled transistor and a first input transistor and a second input transistor, where the first input transistor may be coupled to the first additional transistor and the second additional transistor, the second input transistor may be coupled to the first other transistor and the second other transistor and the first input transistor and the second input transistor may be coupled to ground.

The frequency divider circuit may also include a second cross-coupling. The second cross-coupling may include a third cross-coupled transistor having a third gate, where the third gate may be separately biased, a fourth cross-coupled transistor having a fourth gate, where the fourth gate may be separately biased and where the third gate may be coupled to the fourth cross-coupled transistor and the fourth gate may be coupled to the third cross-coupled transistor. The frequency divider circuit may also include a third additional transistor having a third additional transistor gate and a fourth additional transistor having a fourth additional transistor gate, where the third additional transistor gate may be coupled to the fourth additional transistor, the fourth additional transistor gate may be coupled to the third additional transistor, the third additional transistor may be coupled to the third cross-coupled transistor and the fourth additional transistor may be coupled to the fourth cross-coupled transistor. The frequency divider circuit may also include a third other transistor and a fourth other transistor, where the third other transistor may be coupled to the third additional transistor and the third cross-coupled transistor and the fourth other transistor may be coupled to the fourth additional transistor and the fourth cross-coupled transistor; and where the second input transistor may be coupled to the third additional transistor and the fourth additional transistor and the first input transistor may be coupled to the third other transistor and the fourth other transistor.

The frequency divider circuit may receive differential input signals at an input frequency at the first input transistor and the second input transistor and may output frequency-divided differential quadrature signals (I, $\bar{I}$, Q, $\bar{Q}$) at the cross-coupled transistors. The frequency-divided differential quadrature signals (I, $\bar{I}$, Q, $\bar{Q}$) may be divided in frequency by an approximate factor of two from the input frequency.

An integrated circuit is also disclosed. The integrated circuit includes a first cross-coupling. The first cross-coupling includes a first cross-coupled transistor having a first gate, where the first gate is separately biased and a second cross-coupled transistor having a second gate, where the second gate is separately biased and where the first gate is coupled to the second cross-coupled transistor and the second gate is coupled to the first cross-coupled transistor.

A method for producing a frequency-divided signal on an integrated circuit is also disclosed. The method includes applying a voltage to at least two cross-coupled transistors on an integrated circuit and applying separate bias voltages to gates of the at least two cross-coupled transistors on the integrated circuit. The method also includes applying at least one oscillating signal to at least one input transistor, causing feedback across an output using the cross-coupled transistors and outputting a frequency-divided signal from an output transistor.

The voltage may be less than 1.3 volts. The frequency-divided signal may include frequency-divided differential quadrature signals (I, $\bar{I}$, Q, $\bar{Q}$), where the frequency-divided differential quadrature signals may be divided by an approximate factor of two from a frequency of the at least one oscillating signal. The method may also include activating a switch for a preamplification mode. The method may also include deactivating a switch for a latching mode.

An apparatus producing a frequency-divided signal is also disclosed. The apparatus includes means for causing an integrated circuit to apply a voltage to at least two cross-coupled transistors and means for causing the integrated circuit to apply separate bias voltages to gates of the at least two cross-coupled transistors. The apparatus also includes means for causing the integrated circuit to apply at least one oscillating signal to at least one input transistor, means for causing the integrated circuit to cause feedback across an output using the cross-coupled transistors and means for causing the integrated circuit to output a frequency-divided signal from an output transistor.

The voltage may be less than 1.3 volts. The frequency-divided signal may include frequency-divided differential quadrature signals (I, $\bar{I}$, Q, $\bar{Q}$), where the frequency-divided differential quadrature signals may be divided by an approximate factor of two from a frequency of the at least one oscillating signal. The apparatus may also include means for causing the integrated circuit to activate a switch for a preamplification mode. The apparatus may also include means for causing the integrated circuit to deactivate a switch for a latching mode.

DETAILED DESCRIPTION

Figure 1:
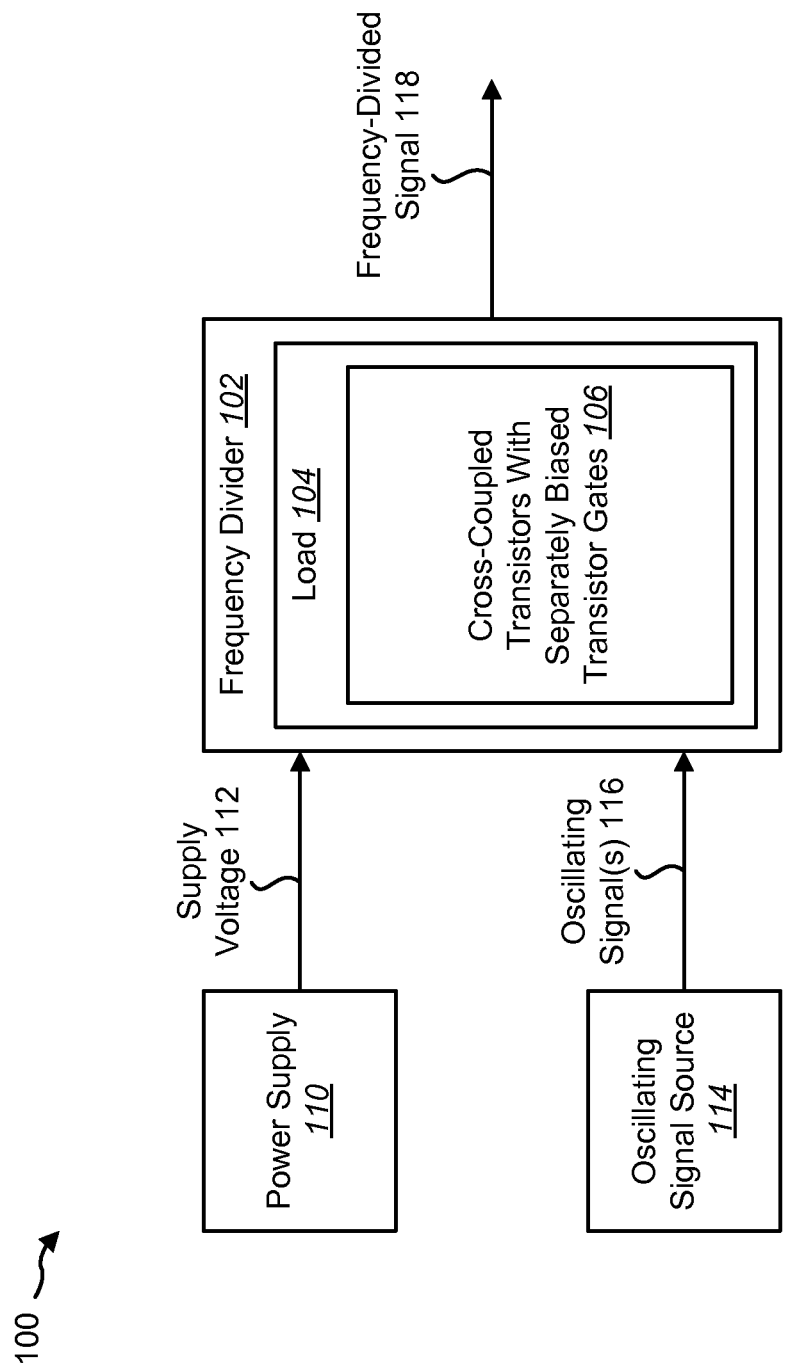
FIG. 1 is a block diagram illustrating one configuration of a clock generation circuit including a frequency divider, a power supply and an oscillating signal source.

As was discussed above, many electronic devices utilize one or more oscillating signals (e.g., clock signals, sinusoidal signals, etc.) at differing frequencies in order to function properly. For example, a cellular phone may use oscillating signals at certain frequencies in order to drive a modulator that modulates a data signal for transmission. Furthermore, designers of mobile electronic devices are striving to create circuits that consume less battery power and occupy less space. However, it may be difficult to meet demands for less power consumption and less chip space when very low phase noise in an oscillating signal is also required.

For example, Wireless Local Area Network (WLAN) standards such as IEEE 802.11a or 802.11b may require low phase noise at 100 megahertz (MHz) and 242 MHz offsets at 2.5 gigahertz (GHz) or 5 GHz local oscillator (LO) frequencies. Some topologies may be used which could meet phase noise requirements. However, meeting the phase noise requirements using these topologies may come at the cost of high power consumption or large area (e.g., in the cases where higher regulated voltages or inductor-based divide-by-two circuits are used). Additionally, if an electronic frequency divider circuit is directly coupled to a Power Management Integrated Circuit (PMIC), noise and spurs may prove to be a problem. Furthermore, if the PMIC supply is regulated, then the regulated voltage level would drop to smaller values and standard frequency divider solutions may not work (e.g., unless an inductor-based design is used, which may consume area).

The systems and methods disclosed herein introduce advantageous designs for a frequency divider circuit. In one configuration, the design of a Current Mode Logic (CML) frequency divider is altered. The electronic frequency divider circuit may use resistive loading to an active transistor load that is cross-coupled with the gates of separately biased transistors. For example, resistive loading to an active P-channel Metal-Oxide-Semiconductor (PMOS) transistor that is cross-coupled with the gates of separately biased PMOS transistors may be used in an electronic frequency divider circuit. This design may be beneficial in that it may give Complementary Metal-Oxide-Semiconductor (CMOS) transistors headroom required to operate at all desired Process-Voltage-Temperature (PVT) corners. Moreover, the systems and methods disclosed herein provide designs that may be compact, low-noise, low-power and can work off a regulated power supply. The systems and methods herein may be applied in many technologies, particularly where voltage headroom poses an issue.

Various configurations are now described with reference to the Figures, where like reference numbers may indicate functionally similar elements. The systems and methods as generally described and illustrated in the Figures herein could be arranged and designed in a wide variety of different configurations. Thus, the following more detailed description of several configurations, as represented in the Figures, is not intended to limit scope, as claimed, but is merely representative of the systems and methods.

It should be noted that the terms "couple," "coupling," "coupled" or other variations of the word couple as used herein may indicate either an indirect connection or a direct connection. For example, if a first component is "coupled" to a second component, the first component may be either indirectly connected to the second component or directly connected to the second component. Furthermore, it should be noted that the term "differential quadrature signals" as used herein may refer to a group of signals including both in-phase (I, $\bar{I}$) and quadrature (Q, $\bar{Q}$) signals. However, the term "differential quadrature signals" as used herein may also refer only to quadrature signals (Q, $\bar{Q}$), depending on context. It should also be noted that the term "bias resistor" or "bias resistors" as used herein may be any type of resistor used in conjunction with a bias voltage. Additionally, it should be noted that as used herein, designating a component or entity (e.g., transistor, capacitor, resistor, power supply, circuit, etc.) as a "first," "second," "third" or "fourth" component may be arbitrary and is used to distinguish components for explanatory clarity. It should also be noted that labels used to designate a "second," "third" or "fourth," etc. do not necessarily imply that elements using preceding labels "first," "second" or "third," etc. are included or used. For example, simply because an element or component is labeled a "third" component does not necessarily imply that "first" and "second" elements or components exist or are used. In other words, the numerical labels (e.g., first, second, third, fourth, etc.) are labels used for ease in explanation and do not necessarily imply a particular number of elements or a particular structure. Thus, the components may be labeled or numbered in any manner.

FIG. 1 is a block diagram illustrating one configuration of a clock generation circuit 100 using a frequency divider 102, a power supply 110 and an oscillating signal source 114. The frequency divider 102 may be an electronic circuit (e.g., integrated circuit) that divides the frequency of an oscillating signal 116. For example, the frequency divider 102 may divide the frequency of the oscillating signal 116 by a factor of two. For instance, assuming that an input oscillating signal 116 is oscillating at 10 GHz at the input to the frequency divider 102, the frequency divider 102 may output a frequency-divided signal 118 at a frequency of 5 GHz.

A power supply 110 may provide electrical power to the frequency divider 102. As illustrated in FIG. 1, the power supply 110 may be connected to the frequency divider 102 and applies a supply voltage 112 to it 102. An oscillating signal source 114 may also be coupled to the frequency divider 102. The oscillating signal source 114 may provide an oscillating signal 116 (e.g., clock signal, sinusoidal signal, etc.) to the frequency divider 102 at a specified frequency. One example of an oscillating signal source 114 is a Voltage Controlled Oscillator (VCO). In one configuration, the oscillating signal source 114 is a VCO included on an integrated circuit that also includes the frequency divider 102 circuit.

The frequency divider 102 circuit may include circuit components including transistors. More details on configurations of frequency divider 102 circuit components are discussed below in connection with FIGS. 6-9. The frequency divider 102 may be configured with an active and/or a passive load 104. The load 104 may include cross-coupled transistors with separately biased transistor gates 106. In one example of cross-coupling, the gate of a first cross-coupled PMOS transistor is coupled (e.g., via a capacitor) to the drain of a second cross-coupled PMOS transistor, and the gate of the second cross-coupled PMOS transistor is coupled (e.g., via a capacitor) to the drain of the first cross-coupled PMOS transistor.

The systems and methods disclosed herein may allow a frequency divider circuit 102 to operate from a lower supply 112. One reason that the frequency divider circuit 102 can operate from a lower supply 112 is because the cross-coupled PMOS devices can be connected through a capacitor but separately get biased to resistors, for example. It should be noted that direct cross-coupling of PMOS devices may set the output voltage of the latch to one (Voltage Gate to Source) VGS below the supply 112. As a result, the frequency divider circuit 102 would not be functional when the supply 112 is too low.

Figure 2:
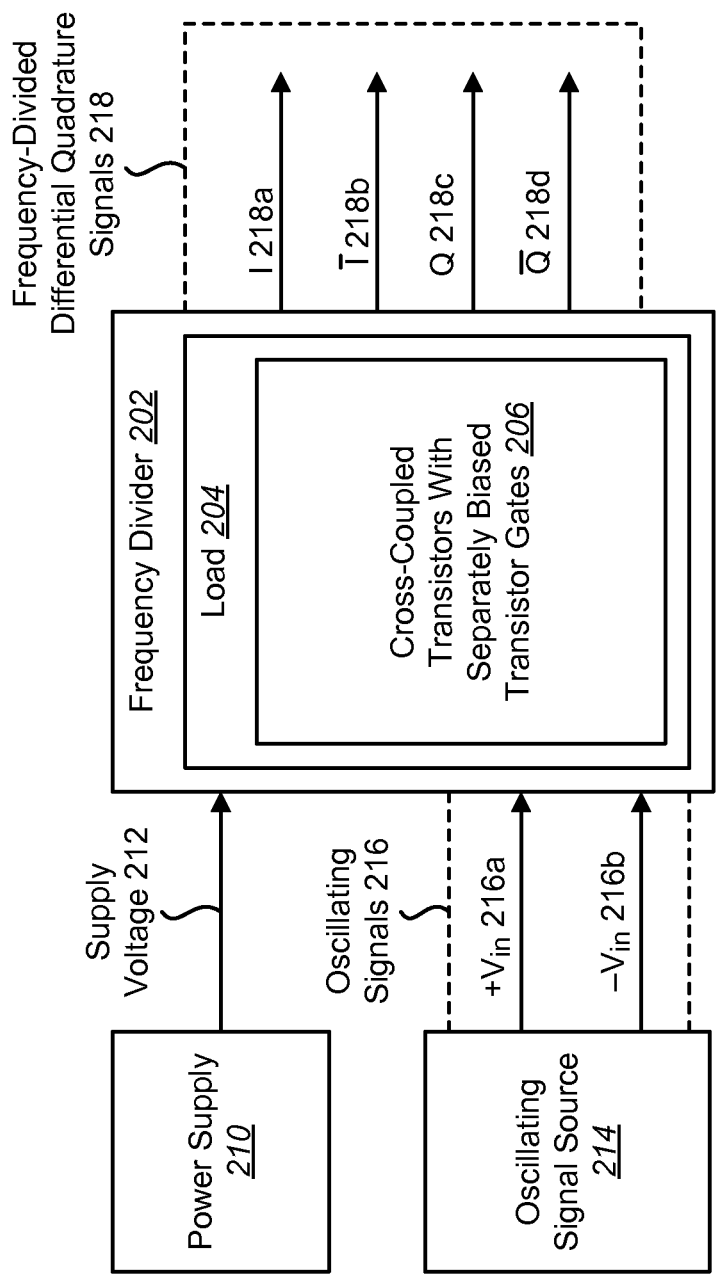
FIG. 2 is a block diagram showing a more specific configuration of a frequency divider.

FIG. 2 is a block diagram showing a more specific configuration of a frequency divider 202. The frequency divider 202 may include a load 204. The load 204 may include capacitively cross-coupled transistors with separately biased transistor gates 206. A supply voltage 212 may be applied to the frequency divider 202 by the power supply 210.

In the configuration illustrated in FIG. 2, the oscillating signal source 214 outputs differential oscillating signals 216. The differential oscillating signals 216 may be inverted or complementary versions of each other. For example, a first oscillating signal 216b (i.e., labeled as $-V_{in}$ in FIG. 2) may be an inverted version of a second oscillating signal 216a (i.e., labeled as $+V_{in}$ in FIG. 2). The use of differential signaling may be useful to combat noise, increase the frequency of operation and provide true quadrature output signals, particularly in low-voltage applications.

The frequency divider 202 may use the oscillating signals 216 to produce frequency-divided differential quadrature signals 218. The differential quadrature signals 218 are output at 90-degree phase angle intervals relative to each other. For example, an in-phase differential quadrature signal 218a (i.e., labeled as I in FIG. 2) may be output at 0 degrees in phase angle. A quadrature differential quadrature signal (i.e., labeled as Q in FIG. 2) 218c may be output at 90 degrees in phase angle. An inverted in-phase differential quadrature signal 218b (i.e., labeled as $\bar{I}$ in FIG. 2) may be output at 180 degrees in phase angle (e.g., as an inverted version of I 218a) while an inverted quadrature differential quadrature signal 218d (i.e., labeled as $\bar{Q}$ in FIG. 2) may be output at 270 degrees in phase angle (e.g., as an inverted version of Q 218c).

Figure 3:
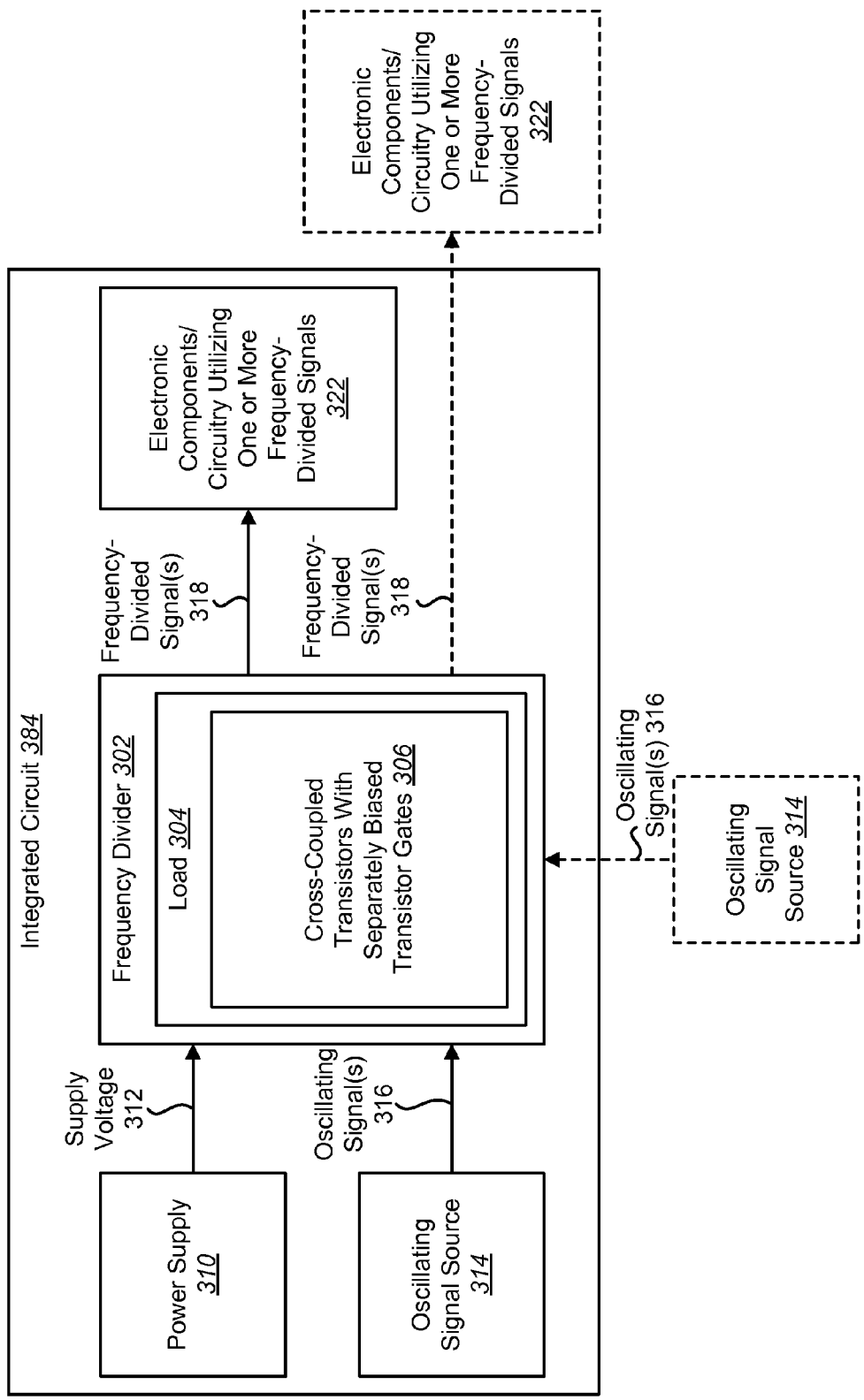
FIG. 3 is a block diagram illustrating one configuration of an integrated circuit wherein a frequency divider may be implemented.

FIG. 3 is a block diagram illustrating one configuration of an integrated circuit 384 wherein a frequency divider 302 may be implemented. The integrated circuit 384 may include a frequency divider 302 and one or more electronic components or circuitry 322 utilizing one or more frequency-divided signals 318. Alternatively, the one or more electronic components or circuitry 322 utilizing one or more frequency-divided signals 318 may be separate from and coupled to the integrated circuit 384. The integrated circuit 384 includes a power supply 310. The power supply 310 may apply a supply voltage 312 to the frequency divider 302. In some implementations, the supply voltage 312 may be a relatively "low" voltage. For example, the supply voltage 312 may be approximately 0.8 volts (V). This is in contrast to higher voltages (e.g., 1.3V) that may be used in other frequency dividers. More generally, the systems and methods disclosed herein may allow a frequency divider 302 to operate at about 62% of (or about 38% less than) a supply voltage used for other frequency dividers that do not use the systems and methods disclosed herein, for example.

The integrated circuit 384 may include an oscillating signal source 314. Alternatively, the oscillating signal source 314 may be separate from and coupled to the integrated circuit 384. The oscillating signal source 314 may provide one or more oscillating signals 316 to the frequency divider 302. As discussed above in relation to FIG. 2, the oscillating signals 316 may be differential signals.

The frequency divider 302 included in the integrated circuit 384 may use the supply voltage 312 and the one or more oscillating signals 316 to produce one or more frequency-divided signals 318. As described above in connection with FIG. 2, the frequency-divided signals 318 may be differential quadrature signals. The one or more frequency-divided signals 318 may be provided or output to the one or more electronic components or circuitry 322 utilizing one or more frequency-divided signals 318. The frequency divider 302 may include a load 304, which may include capacitively cross-coupled transistors with separately biased transistor gates 306. The load 304 (e.g., including capacitively cross-coupled transistors with separately biased transistor gates 306) may allow the frequency divider 302 to operate at a relatively "low" voltage (e.g., 0.8V). This may be beneficial in that other frequency dividers may require a higher voltage (e.g., 1.3V) to function properly. This benefit is due to the fact that according to the systems and methods disclosed herein, the transistor gates can be separately biased.

Figure 4:
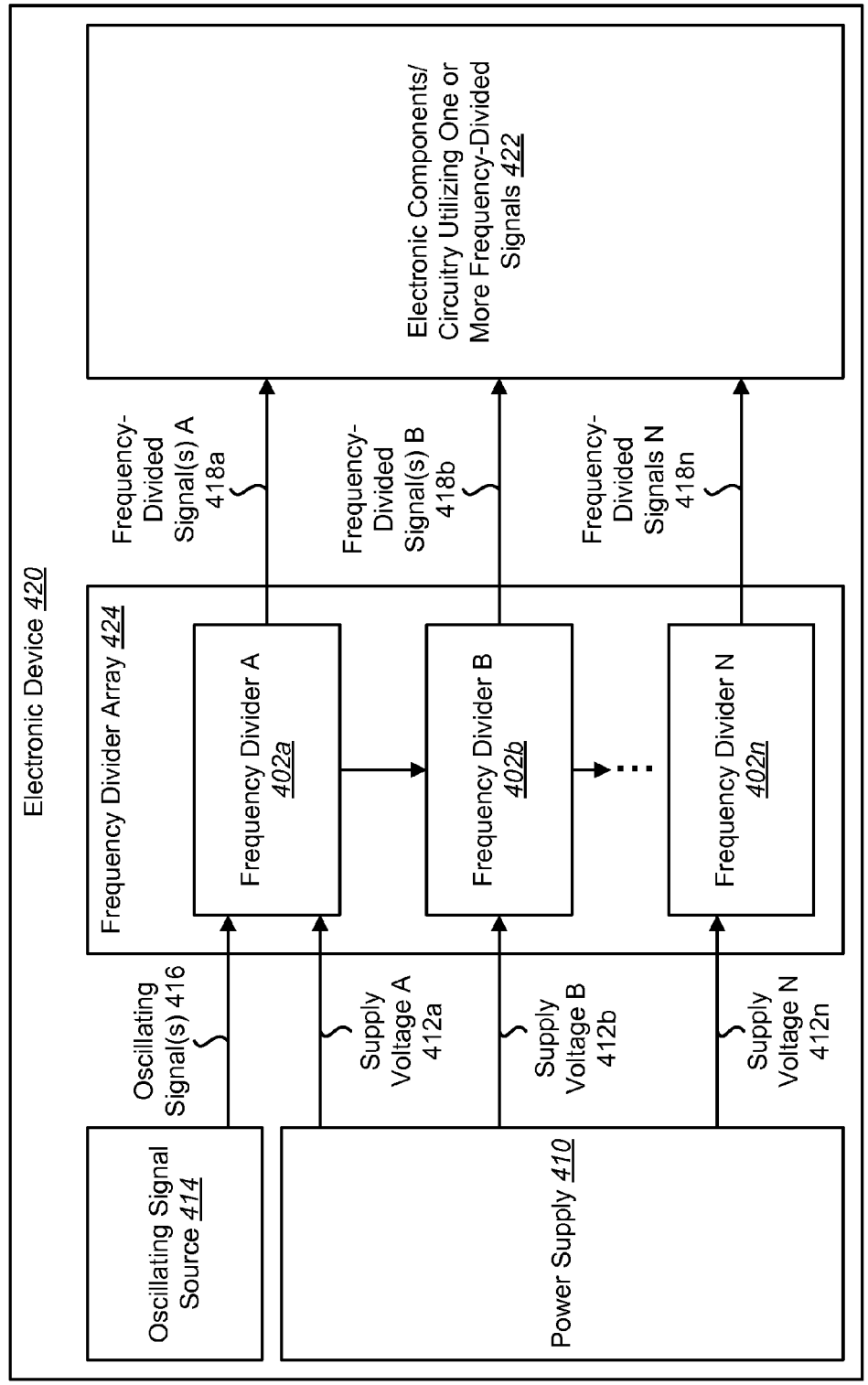
FIG. 4 is a block diagram illustrating one configuration of an electronic device wherein multiple frequency dividers may be implemented.

FIG. 4 is a block diagram illustrating one configuration of an electronic device 420 wherein multiple frequency dividers 402 may be implemented. The electronic device 420 may include an oscillating signal source 414, a power supply 410, a frequency divider array 424 and one or more electronic components or circuitry 422 utilizing one or more frequency-divided signals 418. Similar to the integrated circuit 384 discussed above in connection with FIG. 3, the oscillating signal source 414, the power supply 410 and/or the one or more electronic components or circuitry 422 utilizing one or more frequency-divided signals 418 may be included on the electronic device 420 or may optionally be separate from and coupled to the electronic device 420.

In the configuration illustrated in FIG. 4, the frequency divider array 424 includes one or more frequency dividers 402a-n. The power supply 410 may apply supply voltages 412a-n to respective frequency dividers 402a-n. The supply voltages A-N 412a-n may be the same. The one or more frequency dividers 402a-n may be coupled in series as to produce successive divisions in the oscillating signal 416 frequency. For example, each frequency divider 402 may be a divide-by-two circuit that divides the frequency of its input signal by a factor of two. For example, assume that the oscillating signal source 414 outputs differential oscillating signals 416 at 10 GHz. Frequency divider A 402a may output frequency-divided differential quadrature signals A 418a at 5 GHz. Frequency divider B 402b may receive one or more of the frequency-divided signals at the output of frequency divider A 402a. For example, frequency divider B 402b may receive the in-phase (I) and inverse in-phase (Ī) signals as a differential input at 5 GHz. Frequency divider B 402b may output, for example, frequency-divided differential quadrature signals B 418b at 2.5 GHz. Successive signal frequency divisions may continue though frequency divider N 402n, with each successive frequency divider 402 further dividing the frequency of the oscillating signal 416. Continuing with the example, assuming that frequency divider N 402n is the third divider in the frequency divider array 424, the frequency-divided signals N 418n would be at a frequency of 1.25 GHz.

Each of the frequency-divided signals 418a-n (e.g., or groups of frequency-divided signals 418a-n) may be output to one or more electronic components or circuitry 422 utilizing one or more frequency-divided signals 418. One example of electronic components or circuitry 422 utilizing one or more frequency-divided signals 418 is discussed in connection with FIG. 5 below.

Figure 5:
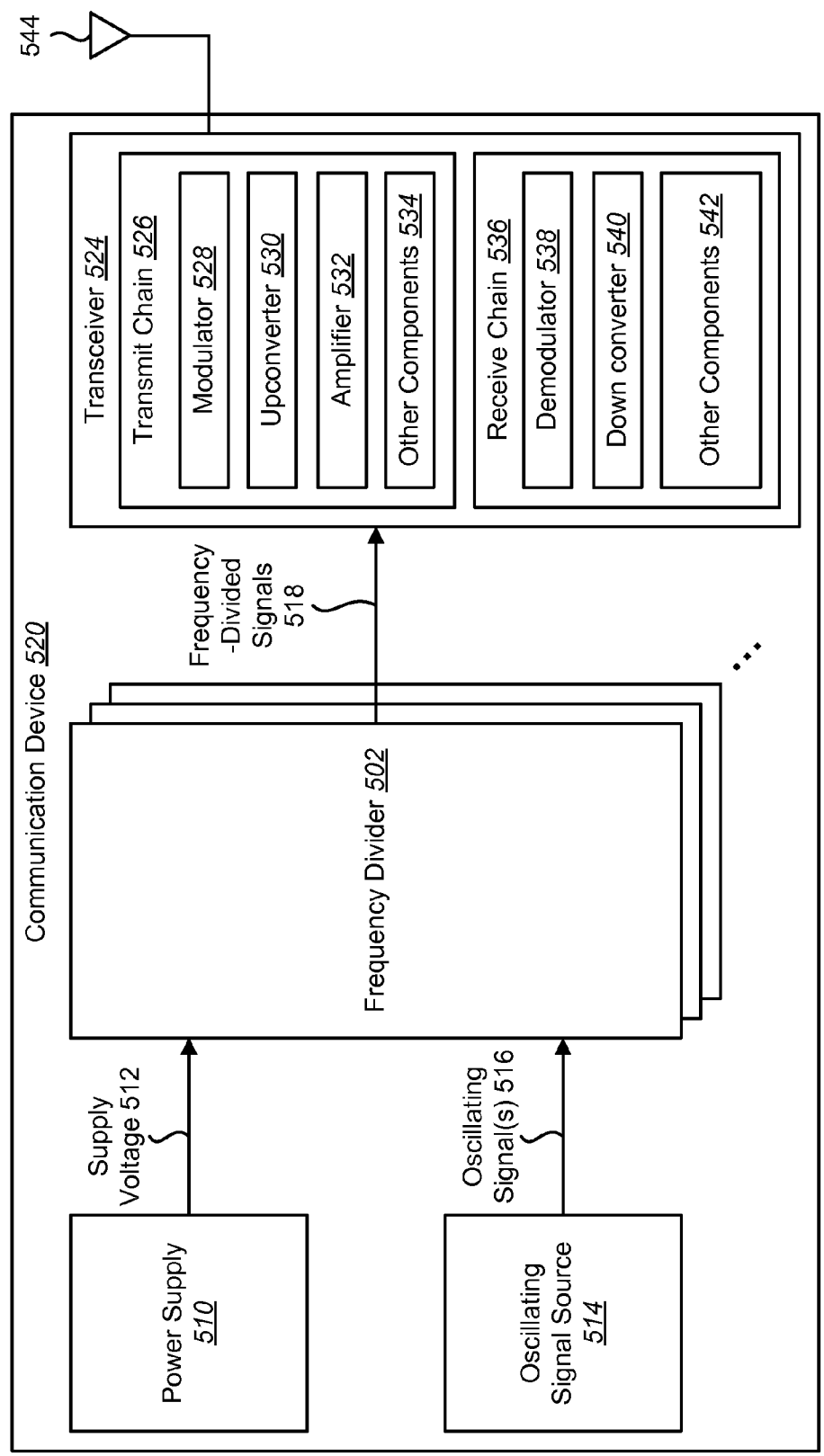
FIG. 5 is a block diagram illustrating one configuration of a communication device utilizing one or more frequency dividers.

FIG. 5 is a block diagram illustrating one configuration of a communication device 520 utilizing one or more frequency dividers 502. Examples of a communication device 520 include a wireless communication device (e.g., a cellular phone, a laptop computer, a smart phone, a netbook, an e-reader, a personal digital assistant (PDA), a music player, a gaming system, etc.) and a base station (e.g., a wireless access point (e.g., in accordance with the specifications from the Institute of Electronics and Electrical Engineers (IEEE) 802.11a, 802.11b, 802.11g, 802.11n, etc.), a cellular telephone tower, etc.).

The communication device 520 may include a power supply 510, an oscillating signal source (e.g., VCO) 514, one or more frequency dividers 502, a transceiver 524 and an antenna 544. The power supply 510 may be, for example, a regulated power supply powered by a battery. The power supply 510 may provide a Direct Current (DC) supply voltage 512. The power supply 510 may apply the supply voltage 512 to the frequency divider 502 and the oscillating signal source 514 may produce one or more oscillating signals 516 for the one or more frequency dividers 502. As discussed above, the frequency divider 502 may produce one or more frequency-divided signals 518 (e.g., frequency-divided differential quadrature signals). Additional frequency dividers 502 may produce additional frequency-divided signals (e.g., frequency-divided differential quadrature signals) at successive divisions of the frequency of the one or more oscillating signals 516.

In the configuration illustrated in FIG. 5, the communication device 520 includes a transceiver 524. The transceiver 524 may be coupled to an antenna 544 for transmitting and receiving signals (e.g., Radio Frequency (RF) signals). The transceiver 524 may include a transmit chain 526 and a receive chain 536. In one example, the transmit chain 526 includes a modulator 528, an upconverter 530, an amplifier 532 and other components 534. In this example, the receive chain 536 includes a demodulator 538, a downconverter 540 and other components 542.

The transceiver 524 may receive and utilize one or more frequency-divided signals 518 from the one or more frequency dividers 502. For example, the modulator 528 may use one or more frequency-divided signals 518 to modulate a voice or data signal in preparation for transmission. Furthermore, the upconverter 530 may use one or more frequency-divided signals 518 to upconvert a signal for transmission. Additionally, the demodulator 538 and/or downconverter 540 may use one or more frequency-divided signals 518 in the downconversion and demodulation processes of a received signal. The frequency divider 502 may also be used for data demultiplexing in wireline transceivers, as well as for circuits used for instrumentation, for example.

Figure 6:
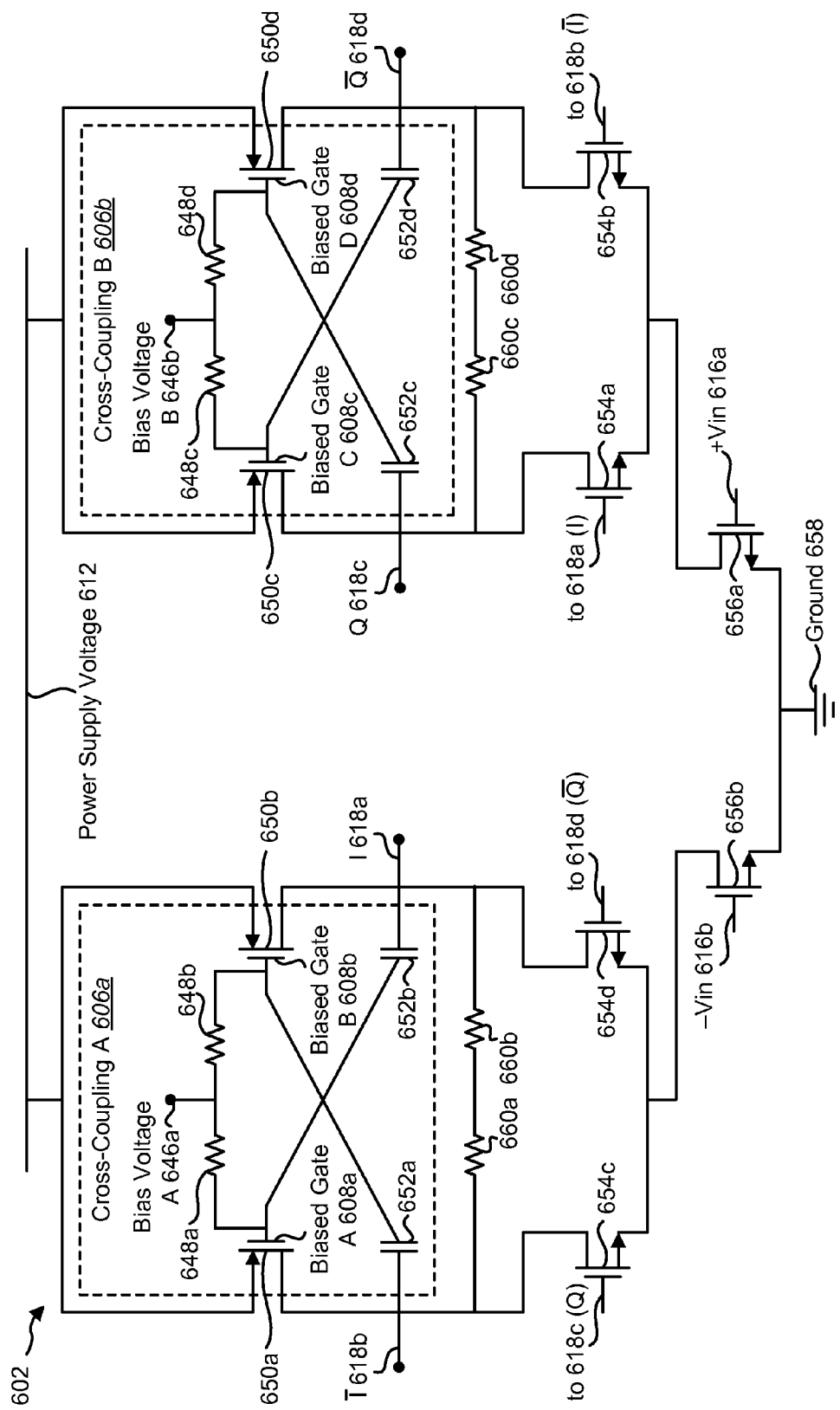
FIG. 6 is a circuit diagram illustrating one configuration of a frequency divider circuit.

FIG. 6 is a circuit diagram illustrating one configuration of a frequency divider circuit 602. In this configuration, the frequency divider circuit 602 uses differential voltage signals $+V_{in}$ 616a and $-V_{in}$ 616b input at the gates of input N-Channel Metal Oxide Semiconductor (NMOS) transistors 656a-b to produce frequency-divided differential quadrature signals I 618a, $\bar{I}$ 618b, Q 618c and $\bar{Q}$ 618d. The frequency divider circuit 602 uses a power supply voltage 612. For example, the power supply voltage 612 may be a "low" voltage (e.g., less than 1.3V, such as 0.8V or about 62% of a nominal voltage for a typical frequency-divider circuit that does not utilize the systems and methods disclosed herein).

The frequency divider circuit 602 may utilize one or more cross-couplings 606a-b. In the configuration illustrated in FIG. 6, cross-coupling A 606a may include two or more cross-coupled PMOS transistors 650a-b. Cross-coupling A 606a may also include one or more bias resistors 648a-b and/or one or more capacitors 652a-b. The bias resistors 648a-b may be respectively coupled to the gates of cross-coupled PMOS transistors 650a-b. The cross-coupled PMOS transistors 650a-b may have separately biased gates 608a-b.

As used herein, a component (e.g., transistor gate) that is "separately biased" may not be connected (e.g., directly connected and/or coupled) to the power supply and may not be biased through a Direct Current (DC) cross-coupled connection. A separately biased component may be separately biased through a resistive biasing circuit. For example, separately biased gates 608a-b, 608c-d may be separately biased from the power supply. In one configuration, each of the separately biased gates 608a-d may be coupled to the same voltage. This may provide symmetry to the frequency divider circuit 602, allowing generation of in-phase and quadrature signals. Separately biasing the gates 608a-d may not be a common practice.

The biases may be provided by bias voltage A 646a through the bias resistors 648a-b. Bias voltage A 646a may be adjustable in order to separately bias the cross-coupled PMOS transistor 650a-b gates 608a-b. Bias voltage A 646a may be supplied by a resistor array that has a fixed current flowing through it. Bias voltage A 646a (and other bias voltages described herein, for example) may be set by tapping different points of the resistor array.

The cross-coupled PMOS transistors 650a-b may be coupled to form capacitive cross-coupling A 606a. For example, the gate 608a of a first cross-coupled PMOS transistor 650a may be coupled to the drain of a second cross-coupled PMOS transistor 650b (e.g., through a second capacitor 652b), while the gate 608b of the second cross-coupled PMOS transistor 650b may be coupled to the drain of the first cross-coupled PMOS transistor 650a (e.g., through a first capacitor 652a) to form capacitive cross-coupling A 606a. An in-phase signal (I) 618a may be provided or output at the drain of a second cross-coupled PMOS transistor 650b and an inverted in-phase signal ($\bar{I}$) 618b may be output at the drain of a first cross-coupled PMOS transistor 650a.

Utilizing a cross-coupling 606a-b including transistors that are capacitively cross-coupled 606a-b with separately biased transistor gates 608a-d may be beneficial. In particular, the cross-couplings 606a-b may give the CMOS transistors adequate headroom to operate at all desired PVT corners. For example, the output (e.g., I 618a, $\bar{I}$ 618b, Q 618c, $\bar{Q}$ 618d) may experience a smaller voltage drop with respect to the power supply voltage 612 (e.g., VDD) than VDD-VGS for a DC coupled design. This may result in more headroom for other devices (e.g., transistors) in the circuit. The cross-couplings 606a-b may work off of a regulated power supply 110 and reduce the power supply voltage 112 needed for a frequency divider circuit 102 to function properly. Using a voltage regulator for the frequency divider circuit 102 may reduce noise from the power supply 110. For example, other frequency divider circuits may have a low Power Supply Rejection Ratio (PSRR), while the systems and methods disclosed herein may improve the PSRR in a frequency divider circuit 102. Additionally, the cross-couplings 606a-b may reduce power consumption and reduce the amount of area needed to implement a frequency divider circuit 102. The cross-couplings 606a-b may also allow the frequency divider circuit 102 to produce signals with low signal noise (e.g., phase noise).

One or more optional resistors 660a-b may be optionally coupled between the drains of the cross-coupled PMOS transistors 650a-b in cross-coupling A 606a. These optional resistors 660a-b may improve phase noise performance of the frequency divider circuit 602. For example, each latch may operate in two modes. In a preamplification (e.g., tracking) mode, a latch tracks its input and changes the output value 618 accordingly. In a latching (e.g., hold) mode, a latch amplifies the tracked value using the positive feedback of cross-coupled devices 650. The optional resistors 660a-d may provide the required impedance for preamplification. They 660a-d also help to overwrite the latch value immediately after a latching period. At very high frequencies, the latch value can quickly get overwritten through these resistors and the parasitic output capacitances. As used herein, a "latch" may comprise a half-circuit (e.g., half of a frequency divider circuit). For example, half of the frequency divider circuit 602 may be a latch. A frequency divider may be formed by the cascade of two latches in a loop.

The drains of the cross-coupled PMOS transistors 650a-b in cross-coupling A 606a may be coupled to the drains of other NMOS transistors 654c-d. The gates of these NMOS transistors 654c-d may be coupled to (output) frequency-divided differential quadrature signals (Q, $\bar{Q}$) 618c-d. For example, the gate of another first NMOS transistor 654c is connected to a third output (Q) 618c and the gate of a second NMOS transistor 654d is connected to a fourth output ($\bar{Q}$) 618d. The sources of the NMOS transistors 654c-d may be coupled to the drain of an input NMOS transistor 656b. An inverted oscillating voltage signal $-V_{in}$ 616b may be input at the gate of the first input NMOS transistor 656b. The source of the first input NMOS transistor 656b may be coupled to ground 658. In an alternative configuration, the common sources of the input transistors 656a-b may be connected to a current source. The other terminal of the current source may be connected to ground 658 in that configuration.

The frequency divider circuit 602 may utilize the power supply voltage 612 and capacitive cross-coupling B 606b. Cross-coupling B 606b may include bias resistors 648c-d, cross-coupled PMOS transistors 650c-d and/or capacitors 652c-d. The bias resistors 648c-d may be respectively coupled to the gates of cross-coupled PMOS transistors 650c-d. Bias voltage B 646b may be applied to the gates of the cross-coupled PMOS transistors 650c-d through the bias resistors 648c-d. Thus, separately biased gates C and D 608c-d may be biased using adjustable bias voltage B 646b. Capacitive cross-coupling B 606b may be formed by coupling the gates of the cross-coupled PMOS transistors 650c-d to the drains of each other through capacitors 652c-d. Frequency-divided differential quadrature signals (Q, $\overline{Q}$) 618c-d may be provided or output at the drains of the (third and fourth) cross-coupled PMOS transistors 650c-d.

One or more optional resistors 660c-d may be optionally coupled between the drains of the cross-coupled PMOS transistors 650c-d in cross-coupling B 606b. These optional resistors 660c-d may improve phase noise performance of the frequency divider circuit 602.

The drains of the cross-coupled PMOS transistors 650c-d in cross-coupling B 606b may be coupled to the drains of NMOS transistors 654a-b. The gates of these NMOS transistors 654a-b may be coupled to (output) differential in-phase signals (I, $\overline{I}$) 618a-b. The sources of the NMOS 654a-b transistors may be coupled to the drain of an input NMOS transistor 656a. An oscillating voltage signal $+V_{in}$ 616a may be input at the gate of the second input NMOS transistor 656a. The source of the second input NMOS transistor 656a may be coupled to ground 658. It should be noted that the capacitors 652 may provide the cross-coupling effect required for positive feedback operation of the latch, without causing the VGS drop from the supply voltage 612, hence improving the headroom for the devices (e.g., transistors) and allowing low-supply operation.

Figure 7:
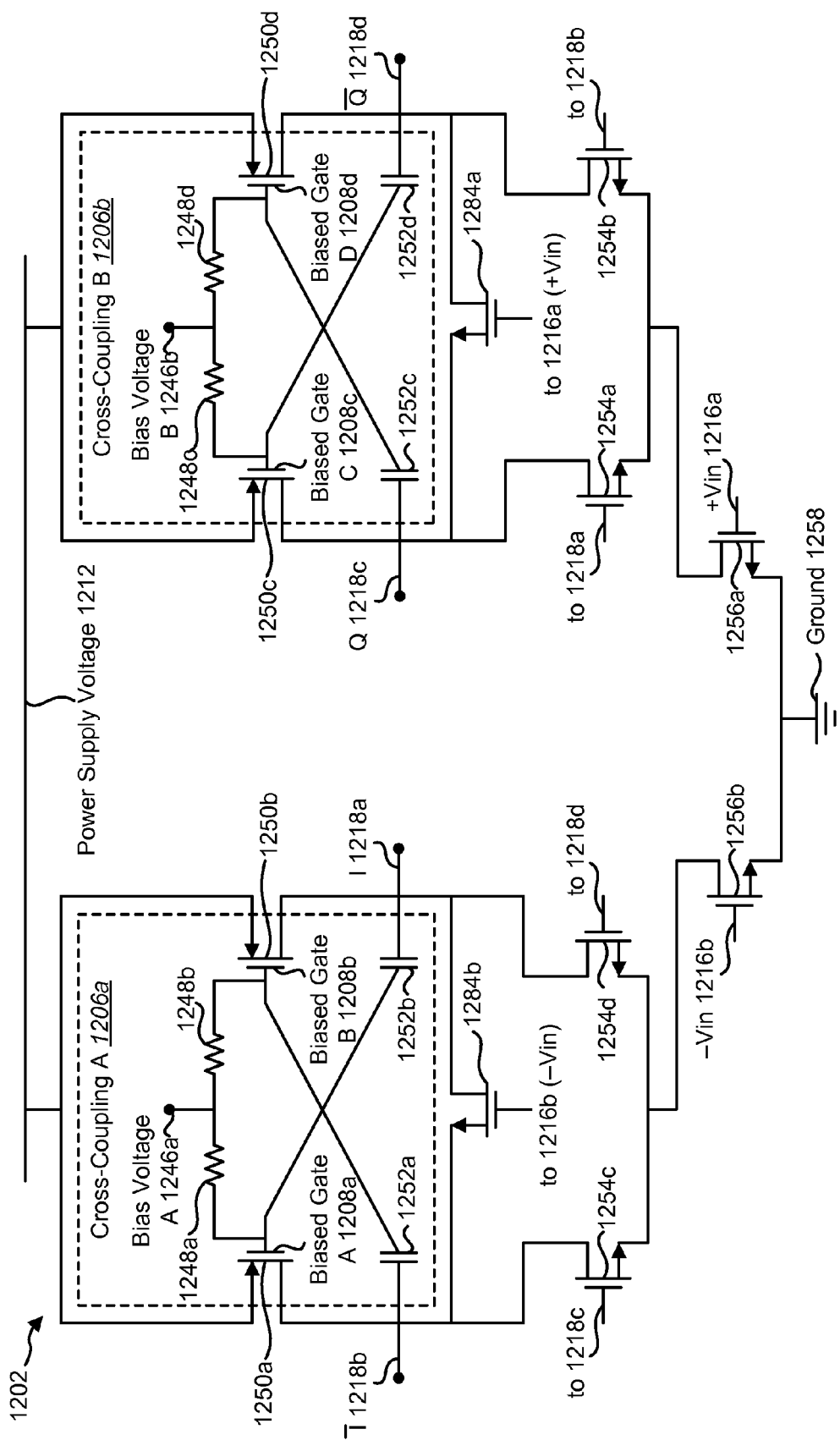
FIG. 7 is a circuit diagram illustrating another configuration of a frequency divider circuit.

FIG. 7 is circuit diagram illustrating another configuration of a frequency divider circuit 1202. Elements 1212, 1206a-b, 1246a-b, 1248a-d, 1250a-d, 1208a-d, 1218a-d, 1252a-d, 1254a-d, 1216a-b, 1256a-b, 1258 of the frequency divider circuit 1202 may operate and/or be configured similarly to corresponding elements 612, 606a-b, 646a-b, 648a-d, 650a-d, 608a-d, 618a-d, 652a-d, 654a-d, 616a-b, 656a-b, 658 as described above in connection with FIG. 6. As illustrated in FIG. 7, however, this configuration may replace resistors 660a-d with switches 1284a-b. More specifically, a switch 1284b may be coupled between the drains of the two cross-coupled PMOS transistors 1250a-b in cross-coupling A 1206a and/or another switch 1284a may be coupled between the drains of the two cross-coupled PMOS transistors 1250c-d in cross-coupling B 1206b. The gate of the switch 1284b that is coupled to cross-coupling A 1206a may be coupled to the gate 1216b of an input transistor 1256b. The gate of the switch 1284a that is coupled to cross-coupling B 1206b may be coupled to the gate 1216a of another input transistor 1256a.

As discussed above, each latch may operate in two modes. In a preamplification (e.g., tracking) mode, a latch tracks its input and changes the output value accordingly. In a latching (e.g., hold) mode, a latch amplifies the tracked value using the positive feedback of cross-coupled devices. Resistors 660a-d as illustrated in FIG. 6 may provide the required impedance for preamplification. They 660a-d also help to overwrite the latch value immediately after a latching period. At very high frequencies, the latch value can quickly get overwritten through these resistors and the parasitic output capacitances.

In the configuration illustrated in FIG. 7, however, the operation range of the frequency divider 1202 may be increased. For example, wider operation range may be achieved if the resistors 660a-d are replaced with switches 1284a-b. These switches 1284a-b may turn on during the preamplification phase to provide forward gain and overwrite the previous latched value but turn off immediately in the latching mode to expedite application of positive feedback. That is, during the preamplification phase, the frequency divider 1202 may operate in preamplification mode. The resistor values 660a-d may have been chosen as a trade-off between a value to provide sufficient gain in preamplification and minimal impact in positive feedback mode. However, as a result of using a switch 1284a-b, these two modes of operation are decoupled, resulting in an increase in operation range and performance.

Figure 8:
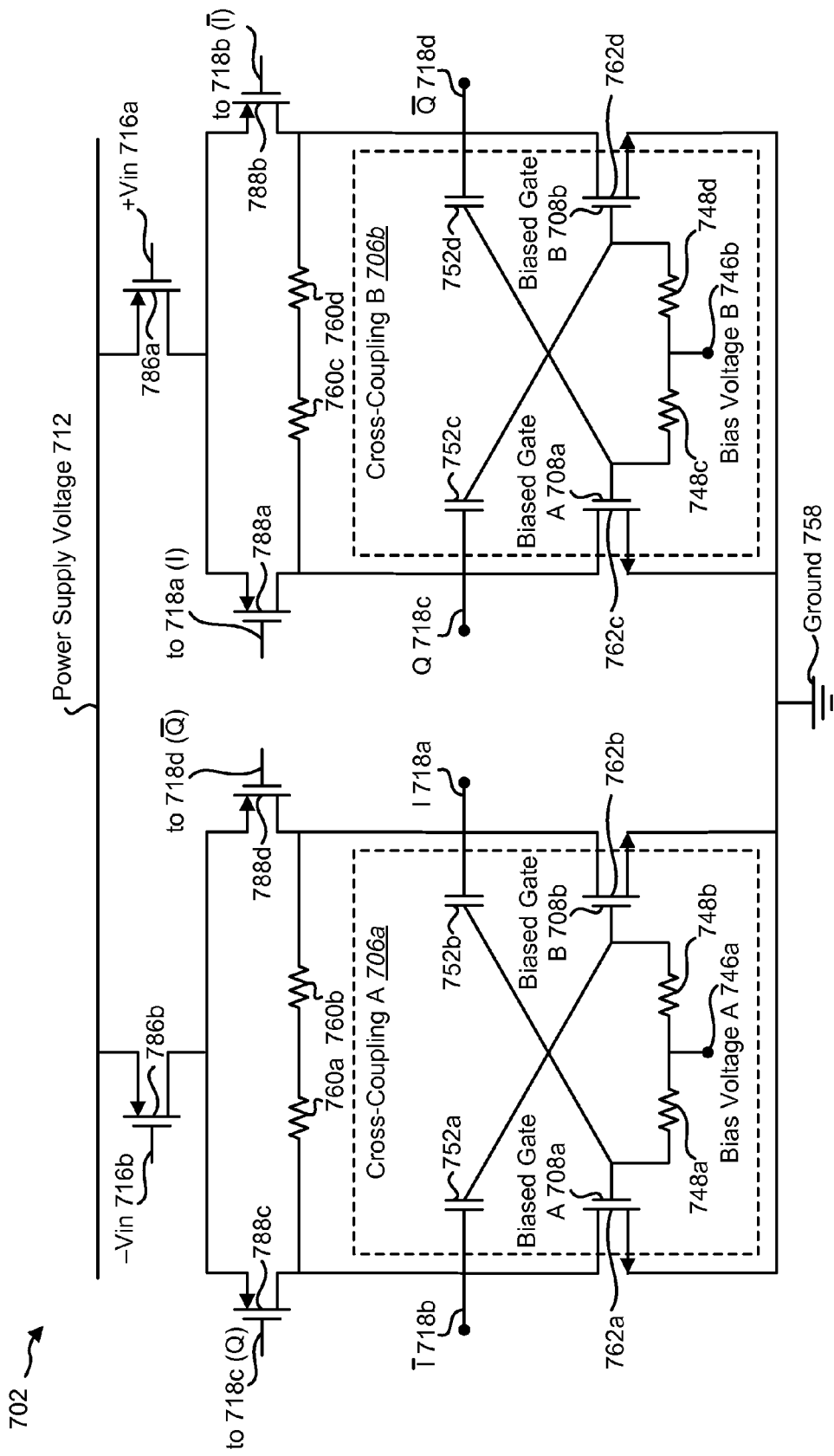
FIG. 8 is circuit diagram illustrating another configuration of a frequency divider circuit.

FIG. 8 is a circuit diagram illustrating another configuration of a frequency divider circuit 702. In this configuration, cross-coupled NMOS transistors 762a-d may be used instead of cross-coupled PMOS transistors 650a-d as described above in relation to FIG. 6. The frequency divider circuit 702 may utilize a power supply voltage 712. The frequency divider circuit 702 may be configured with cross-couplings A and B 706a-b. Cross-coupling A 706a may include bias resistors 748a-b, cross-coupled NMOS transistors 762a-b and capacitors 752a-b. The sources of the cross-coupled NMOS transistors 762a-d may be coupled to ground 758. The separately biased gates A and B 708a-b (e.g., using bias voltage A 746a) of the NMOS transistors 762a-b may be coupled to the drains of each other using capacitors 752a-b to form capacitive cross-coupling A 706a. The bias resistors 748a-b may be respectively coupled to the gates of cross-coupled NMOS transistors 762a-b.

Additionally, cross-coupling B 706b may include bias resistors 748c-d, NMOS transistors 762c-d and/or capacitors 752c-d. The separately biased gates C and D 708c-d (e.g., using bias voltage B 746b) of the NMOS transistors 762c-d may be coupled to the drains of each other using capacitors 752c-d to form capacitive cross-coupling B 706b. The bias resistors 748c-d may be respectively coupled to the gates of cross-coupled NMOS transistors 762c-d.

Optional resistors 760a-b, 760c-d may be optionally coupled between the drains of the cross-coupled NMOS transistors 762a-b in cross-coupling A 706a and between the drains of the cross-coupled NMOS transistors 762c-d in cross-coupling B 706b, respectively. These optional resistors 760a-b, 760c-d may improve phase noise performance of the frequency divider circuit 702. Alternatively, switches may be used as described in connection with FIG. 7. An in-phase signal (I) 718a may be output or provided at the drain of the second cross-coupled NMOS transistor 762b and an inverted in-phase signal ($\overline{I}$) 718b may be output or provided at the drain of the first cross-coupled NMOS transistor 762a. A quadrature signal (Q) 718c may be output or provided at the drain of the third cross-coupled NMOS transistor 762c and an inverted quadrature signal ($\overline{Q}$) 718d may be output or provided at the drain of the fourth cross-coupled NMOS transistor 762d.

The drains of the (first, second, third and fourth) cross-coupled NMOS transistors 762a-b, 762c-d may be respectively coupled to the drains of (first, second, third and fourth) other PMOS transistors 788c-d, 788a-b. The gates of the PMOS transistors 788a-d may be coupled to output differential quadrature signals (I, $\bar{\text{I}}$, Q, $\bar{\text{Q}}$) 718a-d (e.g., the outputs 718a-d). The sources of the (first and second) other PMOS transistors 788c-d may be coupled to the drain of a first input PMOS transistor 786b that receives an inverted oscillating voltage signal −$V_{in}$ 716b. Furthermore, the sources of the (third and fourth) other PMOS transistors 788a-b may be coupled to the drain of a second input PMOS transistor 786a that receives an oscillating voltage signal +$V_{in}$ 716a. The sources of the input PMOS transistors 786a-b may be coupled to the power supply voltage 712.

Figure 9:
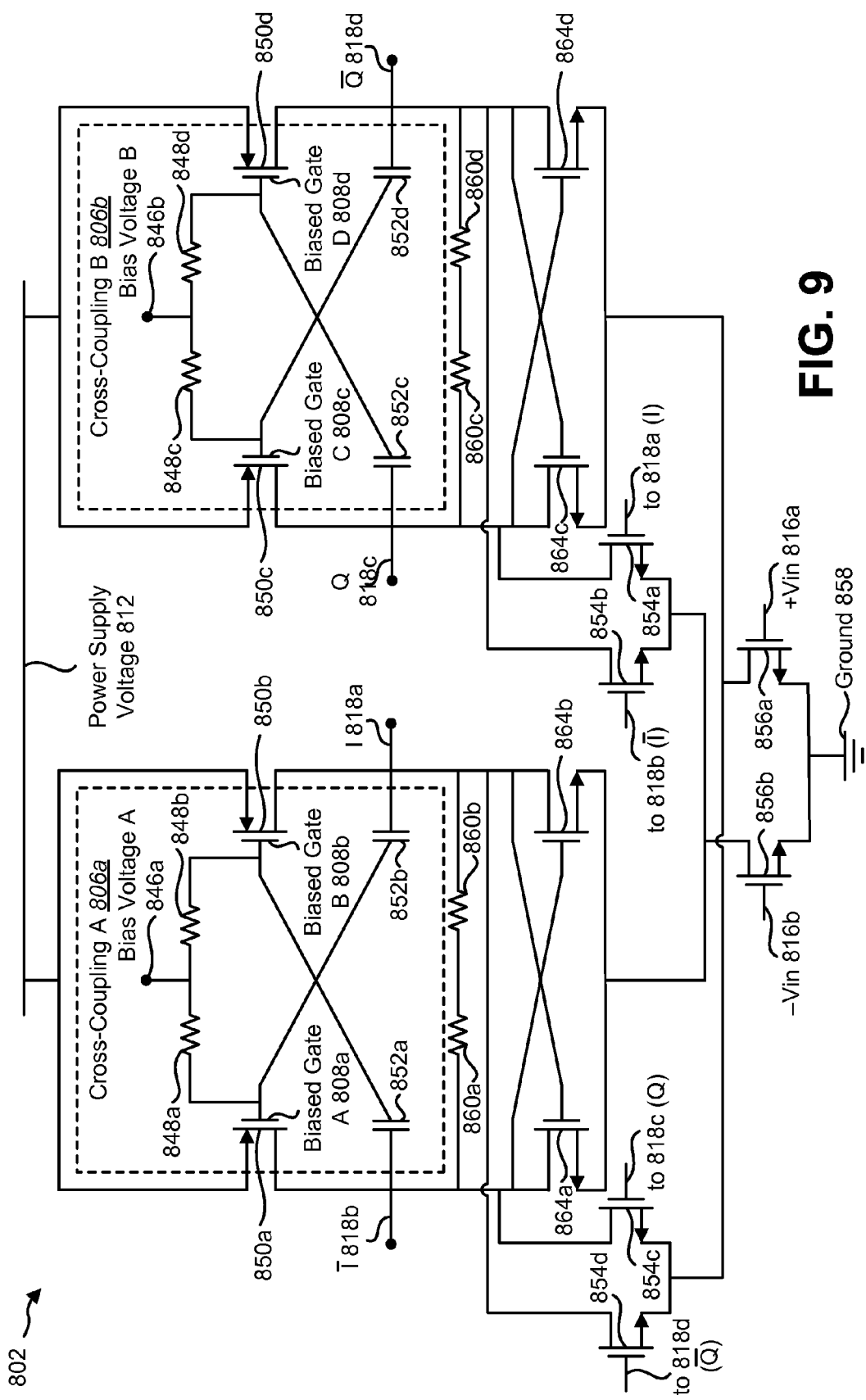
FIG. 9 is circuit diagram illustrating another configuration of a frequency divider circuit.

FIG. 9 is circuit diagram illustrating another configuration of a frequency divider circuit 802. In this configuration, the frequency divider circuit 802 uses differential voltage signals +$V_{in}$ 816a and −$V_{in}$ 816b input at the gates of input NMOS transistors 856a-b to produce frequency-divided (e.g., by a factor of two) differential quadrature signals I 818a, $\bar{\text{I}}$ 818b, Q 818c and $\bar{\text{Q}}$ 818d. The frequency divider circuit 802 uses a power supply voltage 812. For example, the power supply voltage 812 may be a "low" voltage (e.g., less than 1.3V or approximately 0.8V).

The frequency divider circuit 802 may utilize one or more cross-couplings 806a-b. For example, cross-coupling A 806a may include two or more cross-coupled PMOS transistors 850a-b. Alternatively, cross-coupled NMOS transistors may be used as described above. Cross-coupling A 806a may also include one or more bias resistors 848a-b and/or one or more capacitors 852a-b. The bias resistors 848a-b may be respectively coupled to the gates of cross-coupled PMOS transistors 850a-b. The cross-coupled PMOS transistors 850a-b may have separately biased gates 808a-b. The biases may be provided by bias voltage A 846a through the bias resistors 848a-b. Bias voltage A 846a may be adjustable in order to separately bias the cross-coupled PMOS transistor 850a-b gates 808a-b.

The cross-coupled PMOS transistors 850a-b may comprise capacitive cross-coupling A 806a. For example, the gate 808a of a first cross-coupled PMOS transistor 850a may be coupled to the drain of a second cross-coupled PMOS transistor 850b through a second capacitor 852b, while the gate 808b of the second cross-coupled PMOS transistor 850b may be coupled to the drain of the first cross-coupled PMOS transistor 850a through a first capacitor 852a to form capacitive cross-coupling A 806a. Utilizing capacitive cross-couplings 806a-b may be beneficial as described above.

One or more optional resistors 860a-b may be optionally coupled between the drains of the cross-coupled PMOS transistors 850a-b in cross-coupling A 806a. These optional resistors 860a-b may improve phase noise performance of the frequency divider circuit 802. Additionally or alternatively, a switch may be used as described in connection with FIG. 7. An in-phase signal (I) 818a may be output or provided at the drain of the second cross-coupled PMOS transistor 850b and an inverted in-phase signal ($\bar{\text{I}}$) 818b may be output or provided at the drain of the first cross-coupled PMOS transistor 850a.

In the configuration illustrated in FIG. 9, the drains of the cross-coupling PMOS transistors 850a-b may be respectively coupled to the drains of an additional pair of NMOS transistors 864a-b. That is, the drain of a first cross-coupled PMOS transistor 850a may be coupled to the drain of a first additional NMOS transistor 864a and the drain of a second cross-coupled PMOS transistor 850b may be coupled to the drain of a second additional NMOS transistor 864b. The gates of these additional NMOS transistors 864a-b may be coupled to each other's drains. For example, the gate of the first additional NMOS transistor 864a may be coupled to the drain of the second additional NMOS transistor 864b and the gate of the second additional NMOS transistor 864b may be coupled to the drain of the first additional NMOS transistor 864a. That is, the additional NMOS transistors 864 may be cross-coupled. The sources of these additional NMOS transistors 864a-b may be coupled to the drain of an input NMOS transistor 856b. The gate of the first input NMOS transistor 856b may receive an inverted oscillating signal −$V_{in}$ 816b. The source of the first input NMOS transistor 856b may be coupled to ground 858.

The drains of the cross-coupled PMOS transistors 850a-b and the drains of the additional NMOS transistors 864a-b may be coupled to the drains of NMOS transistors 854c-d. Specifically, the drain of the first cross-coupled PMOS transistor 850a and the drain of the first additional NMOS transistor 864a may be coupled to the drain of another first NMOS transistor 854c and the drain of the second cross-coupled PMOS transistor 850b and the drain of the second additional NMOS transistor 864b may be coupled to the drain of another second NMOS transistor 854d. The gates of these NMOS transistors 854c-d may by coupled to frequency-divided differential quadrature signals (Q, $\bar{\text{Q}}$) 818c-d (e.g., outputs 818c-d). The sources of the NMOS transistors 854c-d may be coupled to the drain of an input NMOS transistor 856a. An oscillating voltage signal +$V_{in}$ 816a may be input at the gate of the second input NMOS transistor 856a. The source of the input NMOS transistor 856a may be coupled to ground 858.

The frequency divider circuit 802 may utilize the power supply voltage 812 and cross-coupling B 806b. More specifically, cross-coupling B 806b may include bias resistors 848c-d, cross-coupled PMOS transistors 850c-d and/or capacitors 852c-d. The bias resistors 848c-d may be respectively coupled to the gates of cross-coupled PMOS transistors 850c-d. Bias voltage B 846b may be applied to the gates of the cross-coupled PMOS transistors 850c-d through the bias resistors 848c-d. Thus, separately biased gates C and D 808c-d may be biased using adjustable bias voltage B 846b. Cross-coupling B 806b may be formed by coupling the gates of the cross-coupled PMOS transistors 850c-d to the drains of each other through capacitors 852c-d as illustrated.

One or more optional resistors 860c-d may be optionally coupled between the drains of the cross-coupled PMOS transistors 850c-d. These optional resistors 860c-d may improve phase noise performance of the frequency divider circuit 802. Additionally or alternatively, a switch may be used as described above in connection with FIG. 7. A quadrature signal (Q) 818c may be output or provided at the drain of the third cross-coupled PMOS transistor 850c and an inverted quadrature signal ($\bar{\text{Q}}$) 818d may be output or provided at the drain of the fourth cross-coupled PMOS transistor 850d.

In the configuration illustrated in FIG. 9, the drains of the (third and fourth) cross-coupled PMOS transistors 850c-d may be respectively coupled to the drains of an additional pair of NMOS transistors 864c-d (e.g., third and fourth additional NMOS transistors 864c-d). The gates of these additional NMOS transistors 864c-d may be coupled to each other's drains (e.g., cross-coupled). The sources of these additional NMOS transistors 864c-d may be coupled to the drain of a second input NMOS transistor 856a. The gate of the second input NMOS transistor 856a may receive an oscillating signal +$V_{in}$ 816a. The source of the second input NMOS transistor 856a may be coupled to ground 858.

The drains of the (third and fourth) cross-coupled PMOS transistors 850c-d and the drains of the (third and fourth) additional NMOS transistors 864c-d may be respectively coupled to the drains of (third and fourth) other NMOS transistors 854a-b. The gates of these other NMOS transistors 854a-b may be respectively coupled to frequency-divided differential in-phase signals (I, Ī) 818a-b (e.g., outputs 818a-b). The sources of the (third and fourth) other NMOS transistors 854a-b may be coupled to the drain of a first input NMOS transistor 856b. An inverted oscillating voltage signal $-V_{in}$ 816b may be input at the gate of the first input NMOS transistor 856b. The source of the first input NMOS transistor 856b may be coupled to ground 858.

Figure 10:
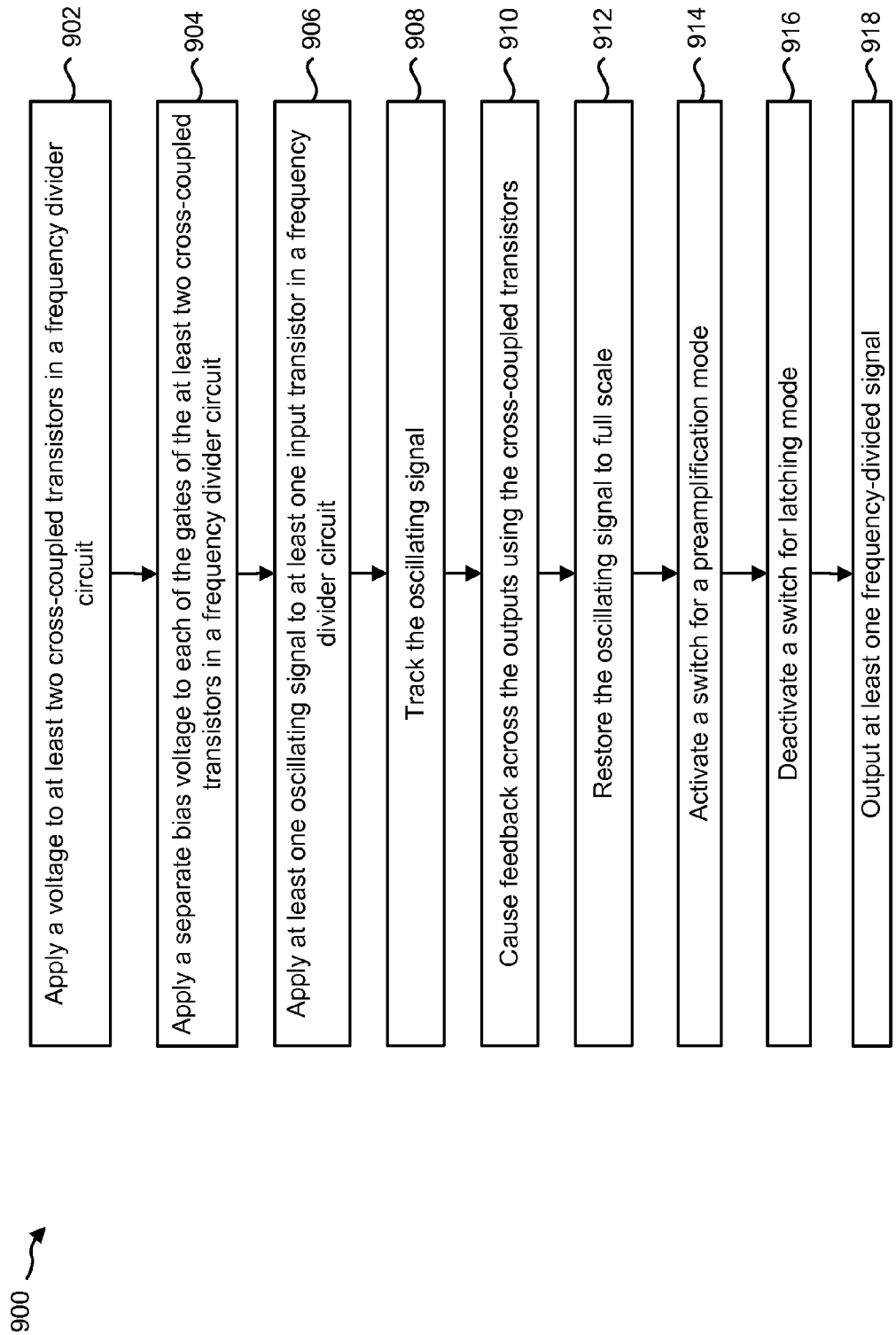
FIG. 10 is a flow diagram illustrating one configuration of a method for producing a frequency-divided signal.

FIG. 10 is a flow diagram illustrating one configuration of a method 900 for producing a frequency-divided signal. A voltage (e.g., a supply voltage 112) may be applied 902 to at least two cross-coupled transistors in a frequency divider circuit 102. The voltage may originate from a "low" supply voltage (e.g., less than 1.3V or approximately 0.8V). For example, a supply voltage 112 may be applied to sources of the at least two cross-coupled transistors in the case that the at least two cross-coupled transistors are PMOS transistors 650.

Bias voltages 646 may be applied 904 to each of the gates of the at least two cross-coupled transistors in the frequency divider circuit 102. Separately biasing 904 the gates of the at least two cross-coupled transistors may be accomplished by applying a bias voltage (e.g., bias voltage 646) to each cross-coupled transistor gate through resistors (e.g., bias resistors 648) that are coupled to the cross-coupled transistor gates. The bias voltage may be adjustable.

At least one oscillating signal 116 may be applied 906 to at least one input transistor (e.g., input transistor 656) in the frequency divider circuit 102. The oscillating signal 116 may be applied 906 at the gate of the at least one input transistor. For example, when only one input transistor is used, one oscillating signal 116 may be input into the gate of that input transistor. If more than one (e.g., two) input transistors are used, then another (e.g., differential) oscillating signal 116 may be input into the gate of the other input transistor. In one configuration, the input transistors may be NMOS transistors. The oscillating signals 116 may be inverted versions of each other (e.g., $+V_{in}$, $-V_{in}$) when more than one oscillating signal is used, for example.

When the voltage (e.g., supply voltage 112) is applied 902, the bias voltage is applied 904 and the oscillating signal 906 is applied 906, the frequency divider circuit may operate. For example, each latch (e.g., half of the frequency divider circuit 602) tracks 908 the input (e.g., Vin 616) for a half cycle when the signal is high. When the signal goes low, the cross-coupled circuit causes 910 positive feedback across the outputs (e.g., outputs 618) and restores 912 the signal to full scale while latching the value. This alternating scheme produces (divider) output signals at half of the input frequency.

In some configurations, the frequency divider circuit 102 may optionally activate 914 one or more switches for a preamplification mode. This may be accomplished as described above in connection with FIG. 7. In some configurations, the frequency divider circuit 102 may optionally deactivate 916 one or more switches for a latching mode. This may be accomplished as described above in connection with FIG. 7.

The frequency divider circuit 102 may then output 914 at least one frequency-divided signal 118. For example, one or more frequency-divided signals (e.g., I, Ī, Q, Q̄) may be provided by or output from the frequency divider circuit. The at least one frequency-divided signal may be output 914 to one or more electronic components or circuitry 322 utilizing the frequency-divided signal.

Figure 11:
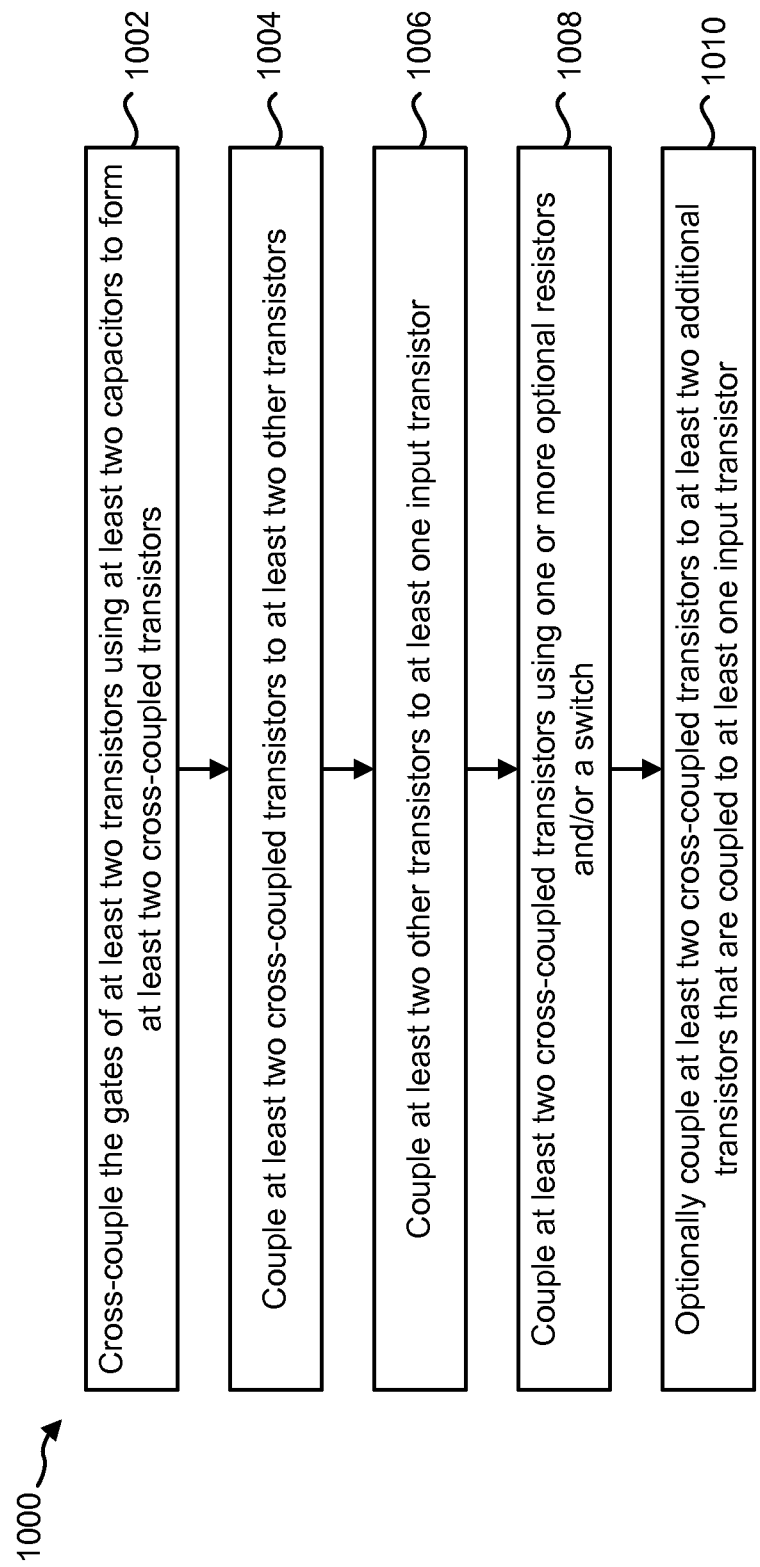
FIG. 11 is a flow diagram illustrating one configuration of a method for manufacturing a frequency divider circuit.

FIG. 11 is a flow diagram illustrating one configuration of a method 1000 for manufacturing a frequency divider circuit 102. The gates of at least two transistors (e.g., PMOS transistors 650, NMOS transistors 762) may be capacitively cross-coupled 1002 using at least two capacitors (e.g., capacitors 652, 752) to form at least two cross-coupled transistors. In the case that the cross-coupled transistors are PMOS transistors 650, the cross-coupled PMOS transistors 650 may be capacitively cross-coupled 1002 by coupling each of the cross-coupled PMOS transistor 650 gates 608 to each other's drain through a capacitor 652. In the case that the cross-coupled transistors are NMOS transistors 762, the cross-coupled NMOS transistors 762 may be capacitively cross-coupled 1002 by coupling each of the cross-coupled NMOS transistor gates 708 to each other's NMOS transistor 762 drain through a capacitor 752.

The at least two cross-coupled transistors may be coupled 1004 to at least two other transistors (e.g., transistors 654, 788). The at least two other transistors may be NMOS or PMOS transistors. The at least two other transistors may be coupled 1006 to at least one input transistor (e.g., input transistor 656, 786), which may be an NMOS or PMOS transistor. The at least two cross-coupled transistors may optionally be coupled 1008 to each other using one or more optional resistors (e.g., optional resistors 660, 760). In the case of cross-coupled PMOS transistors 650, for example, the one or more optional resistors 660 may be coupled between cross-coupled PMOS transistor 650 drains. In the case of cross-coupled NMOS transistors 762, the one or more optional resistors 760 may be coupled 1008 between cross-coupled NMOS transistor 762 drains. These optional resistors may improve the phase noise performance of the frequency divider circuit 102. Additionally or alternatively, the cross-coupled transistors may be optionally coupled 1008 to each other (e.g., each other's drain) using a switch (e.g., switch 1284). The at least two cross-coupled transistors may optionally be coupled 1010 to at least two additional transistors 864 that are coupled to an input transistor (e.g., input transistor 856, 786).

Figure 12:
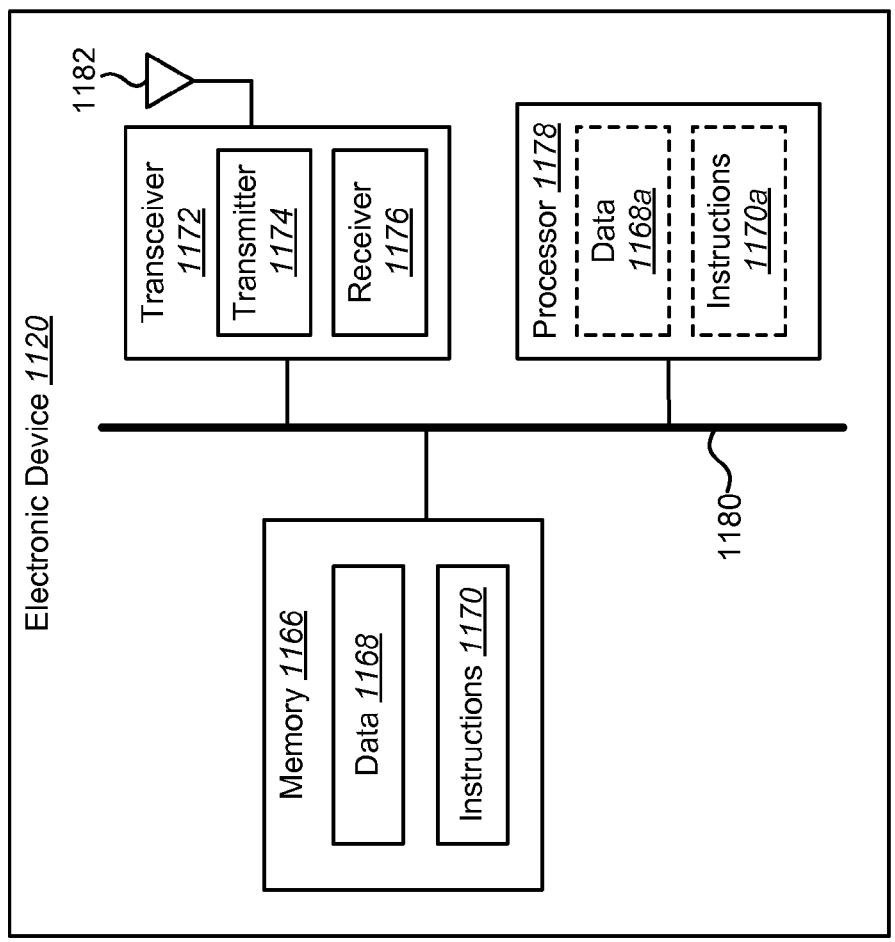
FIG. 12 illustrates certain components that may be included within an electronic device.

FIG. 12 illustrates certain components that may be included within an electronic device 1120. An electronic device 1120 may be, for example, a communication device such as a mobile device/station or a base station. Examples of mobile devices/stations include cellular phones, handheld wireless devices, wireless modems, laptop computers, personal computers, etc. A mobile station may alternatively be referred to as an access terminal, a mobile terminal, a subscriber station, a remote station, a user terminal, a terminal, a subscriber unit, user equipment, etc. Examples of a base station include a cellular phone tower, an IEEE 802.11-compliant wireless router or access point, etc. The present systems and methods may be used on an integrated circuit that may be part of an electronic device 1120. Additionally, the present systems and methods may be used on an integrated circuit 106 that may be part of an electronic device 1120 that is not a communication device. In the case that the electronic device 1120 is not a communication device, the electronic device 1120 block diagram and components would be similar to the electronic device 1120 of FIG. 12 except that the electronic device 1120 may not have a transceiver 1172 and/or antenna 1182. It should be additionally noted that the systems and methods disclosed herein may be alternatively implemented and utilized on an integrated circuit that is not part of an electronic device 1120.

The electronic device 1120 includes a processor 1178. The processor 1178 may be a general purpose single- or multi-chip microprocessor (e.g., an ARM), a special purpose microprocessor (e.g., a digital signal processor (DSP)), a microcontroller, a programmable gate array, etc. The processor 1178 may be referred to as a central processing unit (CPU).

Although just a single processor 1178 is shown in the electronic device 1120 of FIG. 12, in an alternative configuration, a combination of processors (e.g., an ARM and DSP) could be used.

The electronic device 1120 also includes memory 1166. The memory 1166 may be any electronic component capable of storing electronic information. The memory 1166 may be embodied as random access memory (RAM), read-only memory (ROM), magnetic disk storage media, optical storage media, flash memory devices in RAM, on-board memory included with the processor, EPROM memory, EEPROM memory, registers, and so forth, including combinations thereof.

Data 1168 and instructions 1170 may be stored in the memory 1166. The instructions 1170 may be executable by the processor 1178 to implement the methods disclosed herein. Executing the instructions 1170 may involve the use of the data 1168 that is stored in the memory 1166. When the processor 1178 executes the instructions 1170, various portions of the instructions 1170a and various pieces of data 1168a may be loaded onto the processor 1178.

The electronic device 1120 may also include a transmitter 1174 and a receiver 1176 to allow transmission and reception of signals to and from the electronic device 1120. The transmitter 1174 and receiver 1176 may be collectively referred to as a transceiver 1172. An antenna 1182 may be electrically coupled to the transceiver 1172. The electronic device 1120 may also include (not shown) multiple transmitters, multiple receivers, multiple transceivers and/or multiple antenna.

The various components of the electronic device 1120 may be coupled together by one or more buses, which may include a power bus, a control signal bus, a status signal bus, a data bus, etc. For the sake of clarity, the various buses are illustrated in FIG. 12 as a bus system 1180.

The term "determining" encompasses a wide variety of actions and, therefore, "determining" can include calculating, computing, processing, deriving, investigating, looking up (e.g., looking up in a table, a database or another data structure), ascertaining and the like. Also, "determining" can include receiving (e.g., receiving information), accessing (e.g., accessing data in a memory) and the like. Also, "determining" can include resolving, selecting, choosing, establishing and the like.

The phrase "based on" does not mean "based only on," unless expressly specified otherwise. In other words, the phrase "based on" describes both "based only on" and "based at least on."

The term "processor" should be interpreted broadly to encompass a general purpose processor, a central processing unit (CPU), a microprocessor, a digital signal processor (DSP), a controller, a microcontroller, a state machine, and so forth. Under some circumstances, a "processor" may refer to an application specific integrated circuit (ASIC), a programmable logic device (PLD), a field programmable gate array (FPGA), etc. The term "processor" may refer to a combination of processing devices, e.g., a combination of a DSP and a microprocessor, a plurality of microprocessors, one or more microprocessors in conjunction with a DSP core, or any other such configuration.

The term "memory" should be interpreted broadly to encompass any electronic component capable of storing electronic information. The term memory may refer to various types of computer-readable or processor-readable media such as random access memory (RAM), read-only memory (ROM), non-volatile random access memory (NVRAM), programmable read-only memory (PROM), erasable programmable read-only memory (EPROM), electrically erasable PROM (EEPROM), flash memory, magnetic or optical data storage, registers, etc. Memory is said to be in electronic communication with a processor if the processor can read information from and/or write information to the memory. Memory that is integral to a processor is in electronic communication with the processor.

The terms "instructions" and "code" should be interpreted broadly to include any type of processor-readable or computer-readable statement(s). For example, the terms "instructions" and "code" may refer to one or more programs, routines, sub-routines, functions, procedures, etc. "Instructions" and "code" may comprise a single computer-readable statement or many computer-readable statements.

The functions described herein may be implemented in hardware, software, firmware, or any combination thereof. If implemented in software, the functions may be stored as one or more instructions on a processor-readable or computer-readable medium. The terms "computer-readable medium," "computer-program product" or "processor-readable medium" refers to any available medium that can be accessed by a computer or processor. By way of example, and not limitation, such a medium may comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Disk and disc, as used herein, includes compact disc (CD), laser disc, optical disc, digital versatile disc (DVD), floppy disk and Blu-ray® disc where disks usually reproduce data magnetically, while discs reproduce data optically with lasers.

Software or instructions may also be transmitted over a transmission medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of transmission medium.

The methods disclosed herein comprise one or more steps or actions for achieving the described method. The method steps and/or actions may be interchanged with one another without departing from the scope of the claims. In other words, unless a specific order of steps or actions is required for proper operation of the method that is being described, the order and/or use of specific steps and/or actions may be modified without departing from the scope of the claims.

Further, it should be appreciated that modules and/or other appropriate means for performing the methods and techniques described herein, such as those illustrated by FIGS. 9 and 10, can be downloaded and/or otherwise obtained by a device. For example, a device may be coupled to a server to facilitate the transfer of means for performing the methods described herein. Alternatively, various methods described herein can be provided via a storage means (e.g., random access memory (RAM), read-only memory (ROM), a physical storage medium such as a compact disc (CD) or floppy disk, etc.), such that a device may obtain the various methods upon coupling or providing the storage means to the device. Moreover, any other suitable technique for providing the methods and techniques described herein to a device can be utilized.

It is to be understood that the claims are not limited to the precise configuration and components illustrated above. Various modifications, changes and variations may be made in the arrangement, operation and details of the systems, methods, and apparatus described herein without departing from the scope of the claims.

What is claimed is:

1. A frequency divider circuit, comprising:
a first cross-coupling, the first cross-coupling comprising a first cross-coupled transistor having a first gate, wherein the first gate is separately biased by a bias voltage source, and a second cross-coupled transistor having a second gate, wherein the second gate is separately biased by the bias voltage source, and wherein the first gate is coupled to the second cross-coupled transistor and the second gate is coupled to the first cross-coupled transistor; and
a first additional transistor coupled to the first cross-coupled transistor and a second additional transistor coupled to the second cross-coupled transistor, wherein the first additional transistor is cross-coupled with the second additional transistor.

2. The frequency divider circuit of claim 1, wherein the first cross-coupled transistor and the second cross-coupled transistor are coupled to a supply voltage, wherein the supply voltage is less than 1.3 volts.

3. The frequency divider circuit of claim 1, wherein the first gate is coupled to the second transistor using at least one capacitor and the second gate is coupled to the first transistor using at least one capacitor.

4. The frequency divider circuit of claim 1, wherein the first cross-coupled transistor is a P-channel metal-oxide-semiconductor (PMOS) transistor having a first drain and the second cross-coupled transistor is a PMOS transistor having a second drain, wherein the first gate is coupled to the second drain and the second gate is coupled to the first drain.

5. The frequency divider circuit of claim 1, wherein the first cross-coupled transistor is an N-channel metal-oxide-semiconductor (NMOS) transistor having a first drain and the second cross-coupled transistor is an NMOS transistor having a second drain, wherein the first gate is coupled to the second drain and the second gate is coupled to the first drain.

6. The frequency divider circuit of claim 1, wherein the first gate and second gate are each separately biased using a bias voltage applied through at least one bias resistor.

7. The frequency divider circuit of claim 1, further comprising one or more resistors that are coupled between the first cross-coupled transistor and the second cross-coupled transistor.

8. The frequency divider circuit of claim 1, further comprising a switch that is coupled between the first cross-coupled transistor and the second cross-coupled transistor.

9. The frequency divider circuit of claim 1, further comprising:
a first other transistor and a second other transistor, wherein the first other transistor is coupled to the first cross-coupled transistor, the second other transistor is coupled to the second cross-coupled transistor; and
a first input transistor, wherein the first input transistor is coupled to the first other transistor and the second other transistor and the first input transistor is coupled to ground.

10. The frequency divider circuit of claim 9, further comprising:
a second cross-coupling, the second cross-coupling comprising:
a third cross-coupled transistor having a third gate, wherein the third gate is separately biased; and
a fourth cross-coupled transistor having a fourth gate, wherein the fourth gate is separately biased and wherein the third gate is coupled to the fourth cross-coupled transistor and the fourth gate is coupled to the third cross-coupled transistor;
a third other transistor and a fourth other transistor, wherein the third other transistor is coupled to the third cross-coupled transistor and the fourth other transistor is coupled to the fourth cross-coupled transistor and wherein the third cross-coupled transistor and the fourth cross-coupled transistor are coupled to a supply voltage; and
a second input transistor, wherein the second input transistor is coupled to the third other transistor and the fourth other transistor and wherein the second input transistor is coupled to ground.

11. The frequency divider circuit of claim 10, wherein the frequency divider circuit receives differential input signals at an input frequency at the first input transistor and the second input transistor and outputs frequency-divided differential quadrature signals (I, $\bar{I}$, Q, $\bar{Q}$) at the cross-coupled transistors.

12. The frequency divider circuit of claim 11, wherein the frequency-divided differential quadrature signals (I, $\bar{I}$, Q, $\bar{Q}$) are divided in frequency by an approximate factor of two from the input frequency.

13. The frequency divider circuit of claim 1, wherein the first additional transistor has a first additional transistor gate and the second additional transistor has a second additional transistor gate, wherein the first additional transistor gate is coupled to the second additional transistor and the second additional transistor gate is coupled to the first additional transistor, and wherein the frequency divider circuit further comprises:
a first other transistor and a second other transistor, wherein the first other transistor is coupled to the first additional transistor and the first cross-coupled transistor and the second other transistor is coupled to the second additional transistor and the second cross-coupled transistor; and
a first input transistor and a second input transistor, wherein the first input transistor is coupled to the first additional transistor and the second additional transistor, the second input transistor is coupled to the first other transistor and the second other transistor and the first input transistor and the second input transistor are coupled to ground.

14. The frequency divider circuit of claim 13, further comprising:
a second cross-coupling, the second cross-coupling comprising:
a third cross-coupled transistor having a third gate, wherein the third gate is separately biased;
a fourth cross-coupled transistor having a fourth gate, wherein the fourth gate is separately biased and wherein the third gate is coupled to the fourth cross-coupled transistor and the fourth gate is coupled to the third cross-coupled transistor;
a third additional transistor having a third additional transistor gate and a fourth additional transistor having a fourth additional transistor gate, wherein the third additional transistor gate is coupled to the fourth additional transistor, the fourth additional transistor gate is coupled to the third additional transistor, the third additional transistor is coupled to the third cross-coupled transistor and the fourth additional transistor is coupled to the fourth cross-coupled transistor;
a third other transistor and a fourth other transistor, wherein the third other transistor is coupled to the third additional transistor and the third cross-coupled transistor and the fourth other transistor is coupled to the fourth additional transistor and the fourth cross-coupled transistor; and wherein the second input transistor is coupled to the third additional transistor and the fourth additional transistor and the first input transistor is coupled to the third other transistor and the fourth other transistor.

15. The frequency divider circuit of claim 14, wherein the frequency divider circuit receives differential input signals at an input frequency at the first input transistor and the second input transistor and outputs frequency-divided differential quadrature signals (I, Ī, Q, Q̄) at the cross-coupled transistors.

16. The frequency divider circuit of claim 15, wherein the frequency-divided differential quadrature signals (I, Ī, Q, Q̄) are divided in frequency by an approximate factor of two from the input frequency.

17. The frequency divider circuit of claim 1, wherein the bias voltage source is separate from a power supply voltage source.

18. An integrated circuit, comprising:
a first cross-coupling, the first cross-coupling comprising a first cross-coupled transistor having a first gate, wherein the first gate is separately biased by a bias voltage source, and a second cross-coupled transistor having a second gate, wherein the second gate is separately biased by the bias voltage source, and wherein the first gate is coupled to the second cross-coupled transistor and the second gate is coupled to the first cross-coupled transistor; and
a first additional transistor coupled to the first cross-coupled transistor and a second additional transistor coupled to the second cross-coupled transistor, wherein the first additional transistor is cross-coupled with the second additional transistor.

19. The integrated circuit of claim 18, wherein the first cross-coupled transistor and the second cross-coupled transistor are coupled to a supply voltage, wherein the supply voltage is less than 1.3 volts.

20. The integrated circuit of claim 18, wherein the first gate is coupled to the second transistor using at least one capacitor and the second gate is coupled to the first transistor using at least one capacitor.

21. The integrated circuit of claim 18, wherein the first cross-coupled transistor is a P-channel metal-oxide-semiconductor (PMOS) transistor having a first drain and the second cross-coupled transistor is a PMOS transistor having a second drain, wherein the first gate is coupled to the second drain and the second gate is coupled to the first drain.

22. The integrated circuit of claim 18, wherein the first cross-coupled transistor is an N-channel metal-oxide-semiconductor (NMOS) transistor having a first drain and the second cross-coupled transistor is an NMOS transistor having a second drain, wherein the first gate is coupled to the second drain and the second gate is coupled to the first drain.

23. The integrated circuit of claim 18, wherein the first gate and second gate are each separately biased using a bias voltage applied through at least one bias resistor.

24. The integrated circuit of claim 18, further comprising one or more resistors that are coupled between the first cross-coupled transistor and the second cross-coupled transistor.

25. The integrated circuit of claim 18, further comprising a switch that is coupled between the first cross-coupled transistor and the second cross-coupled transistor.

26. The integrated circuit of claim 18, further comprising:
a first other transistor and a second other transistor, wherein the first other transistor is coupled to the first cross-coupled transistor, the second other transistor is coupled to the second cross-coupled transistor; and
a first input transistor, wherein the first input transistor is coupled to the first other transistor and the second other transistor and the first input transistor is coupled to ground.

27. The integrated circuit of claim 26, further comprising:
a second cross-coupling, the second cross-coupling comprising:
a third cross-coupled transistor having a third gate, wherein the third gate is separately biased; and
a fourth cross-coupled transistor having a fourth gate, wherein the fourth gate is separately biased and wherein the third gate is coupled to the fourth cross-coupled transistor and the fourth gate is coupled to the third cross-coupled transistor;
a third other transistor and a fourth other transistor, wherein the third other transistor is coupled to the third cross-coupled transistor and the fourth other transistor is coupled to the fourth cross-coupled transistor and wherein the third cross-coupled transistor and the fourth cross-coupled transistor are coupled to a supply voltage; and
a second input transistor, wherein the second input transistor is coupled to the third other transistor and the fourth other transistor and wherein the second input transistor is coupled to ground.

28. The integrated circuit of claim 27, wherein the integrated circuit receives differential input signals at an input frequency at the first input transistor and the second input transistor and outputs frequency-divided differential quadrature signals (I, Ī, Q, Q̄) at the cross-coupled transistors.

29. The integrated circuit of claim 28, wherein the frequency-divided differential quadrature signals (I, Ī, Q, Q̄) are divided in frequency by an approximate factor of two from the input frequency.

30. The integrated circuit of claim 18, wherein the first additional transistor has a first additional transistor gate and the second additional transistor has a second additional transistor gate, wherein the first additional transistor gate is coupled to the second additional transistor and the second additional transistor gate is coupled to the first additional transistor, and wherein the integrated circuit further comprises:
a first other transistor and a second other transistor, wherein the first other transistor is coupled to the first additional transistor and the first cross-coupled transistor and the second other transistor is coupled to the second additional transistor and the second cross-coupled transistor; and
a first input transistor and a second input transistor, wherein the first input transistor is coupled to the first additional transistor and the second additional transistor, the second input transistor is coupled to the first other transistor and the second other transistor and the first input transistor and the second input transistor are coupled to ground.

31. The integrated circuit of claim 30, further comprising:
a second cross-coupling, the second cross-coupling comprising:
a third cross-coupled transistor having a third gate, wherein the third gate is separately biased;
a fourth cross-coupled transistor having a fourth gate, wherein the fourth gate is separately biased and wherein the third gate is coupled to the fourth cross-coupled transistor and the fourth gate is coupled to the third cross-coupled transistor;

a third additional transistor having a third additional transistor gate and a fourth additional transistor having a fourth additional transistor gate, wherein the third additional transistor gate is coupled to the fourth additional transistor, the fourth additional transistor gate is coupled to the third additional transistor, the third additional transistor is coupled to the third cross-coupled transistor and the fourth additional transistor is coupled to the fourth cross-coupled transistor;

a third other transistor and a fourth other transistor, wherein the third other transistor is coupled to the third additional transistor and the third cross-coupled transistor and the fourth other transistor is coupled to the fourth additional transistor and the fourth cross-coupled transistor; and wherein the second input transistor is coupled to the third additional transistor and the fourth additional transistor and the first input transistor is coupled to the third other transistor and the fourth other transistor.

32. The integrated circuit of claim 31, wherein the integrated circuit receives differential input signals at an input frequency at the first input transistor and the second input transistor and outputs frequency-divided differential quadrature signals (I, $\bar{I}$, Q, $\bar{Q}$) at the cross-coupled transistors.

33. The integrated circuit of claim 32, wherein the frequency-divided differential quadrature signals (I, $\bar{I}$, Q, $\bar{Q}$) are divided in frequency by an approximate factor of two from the input frequency.

34. A method for producing a frequency-divided signal on an integrated circuit, comprising:
applying a voltage to at least two cross-coupled transistors on an integrated circuit;
applying separate bias voltages to gates of the at least two cross-coupled transistors on the integrated circuit, wherein the integrated circuit comprises a first additional transistor coupled to a first cross-coupled transistor and a second additional transistor coupled to a second cross-coupled transistor, wherein the first additional transistor is cross-coupled with the second additional transistor;
applying at least one oscillating signal to at least one input transistor;
causing, on the integrated circuit, feedback across an output using the cross-coupled transistors; and
outputting a frequency-divided signal.

35. The method of claim 34, wherein the voltage is less than 1.3 volts.

36. The method of claim 34, wherein the frequency-divided signal comprises frequency-divided differential quadrature signals (I, $\bar{I}$, Q, $\bar{Q}$), wherein the frequency-divided differential quadrature signals are divided by an approximate factor of two from a frequency of the at least one oscillating signal.

37. The method of claim 34, further comprising activating a switch for a preamplification mode.

38. The method of claim 34, further comprising deactivating a switch for a latching mode.

39. An apparatus producing a frequency-divided signal, comprising:
means for causing an integrated circuit to apply a voltage to at least two cross-coupled transistors;
means for causing the integrated circuit to apply separate bias voltages to gates of the at least two cross-coupled transistors, wherein the integrated circuit comprises a first additional transistor coupled to a first cross-coupled transistor and a second additional transistor coupled to a second cross-coupled transistor, wherein the first additional transistor is cross-coupled with the second additional transistor;
means for causing the integrated circuit to apply at least one oscillating signal to at least one input transistor;
means for causing the integrated circuit to cause feedback across an output using the cross-coupled transistors; and
means for causing the integrated circuit to output a frequency-divided signal.

40. The apparatus of claim 39, wherein the voltage is less than 1.3 volts.

41. The apparatus of claim 39, wherein the frequency-divided signal comprises frequency-divided differential quadrature signals (I, $\bar{I}$, Q, $\bar{Q}$), wherein the frequency-divided differential quadrature signals are divided by an approximate factor of two from a frequency of the at least one oscillating signal.

42. The apparatus of claim 39, further comprising means for causing the integrated circuit to activate a switch for a preamplification mode.

43. The apparatus of claim 39, further comprising means for causing the integrated circuit to deactivate a switch for a latching mode.

* * * * *